(12) United States Patent
Takeuchi

(10) Patent No.: US 11,302,731 B2
(45) Date of Patent: Apr. 12, 2022

(54) ELECTROMAGNETIC WAVE DETECTION APPARATUS AND INFORMATION ACQUISITION SYSTEM

(71) Applicant: KYOCERA Corporation, Kyoto (JP)

(72) Inventor: Eri Takeuchi, Yokohama (JP)

(73) Assignee: KYOCERA Corporation, Kyoto (JP)

( * ) Notice: Subject to any disclaimer, the term of this patent is extended or adjusted under 35 U.S.C. 154(b) by 0 days.

(21) Appl. No.: 17/258,222

(22) PCT Filed: Jul. 17, 2019

(86) PCT No.: PCT/JP2019/028121
§ 371 (c)(1),
(2) Date: Jan. 6, 2021

(87) PCT Pub. No.: WO2020/022151
PCT Pub. Date: Jan. 30, 2020

(65) Prior Publication Data
US 2021/0272998 A1    Sep. 2, 2021

(30) Foreign Application Priority Data

Jul. 27, 2018    (JP) .............................. JP2018-141272

(51) Int. Cl.
*H01L 27/14*    (2006.01)
*H01L 27/146*    (2006.01)
(Continued)

(52) U.S. Cl.
CPC .. *H01L 27/14625* (2013.01); *H01L 27/14649* (2013.01); *H04N 5/33* (2013.01); *H04N 5/351* (2013.01)

(58) Field of Classification Search
CPC ......... H01L 27/14609; H01L 27/14625; H01L 27/14629; H01L 27/14649; H04N 5/33; H04N 5/351
See application file for complete search history.

(56) References Cited

U.S. PATENT DOCUMENTS

| 6,686,602 B2 | 2/2004 | Some |
| 2005/0275959 A1 | 12/2005 | Kawaai et al. |
| (Continued) | | |

FOREIGN PATENT DOCUMENTS

| JP | H0659195 A | 3/1994 |
| JP | 2005535869 A | 11/2005 |
| (Continued) | | |

*Primary Examiner* — Kevin K Pyo
(74) *Attorney, Agent, or Firm* — Studebaker & Brackett PC

(57) ABSTRACT

An electromagnetic wave detection apparatus 10 includes a first image forming unit 15, a prism 17 having a fourth surface s3 for emitting electromagnetic waves incident from the first image forming unit 15, a progression unit 16 that includes a plurality of pixels arranged along a reference surface and is configured to cause electromagnetic waves incident on the reference surface from a fourth surface s4 to progress in a particular direction using each of the pixels, and a first detector 19 configured to detect electromagnetic waves progressing in the particular direction. The prism 17 includes a reflection suppressor 90 that is provided at a position out of a progression path of electromagnetic waves incident from the first image forming unit 15 to be detected by the first detector 19.

10 Claims, 13 Drawing Sheets

(51) Int. Cl.
*H04N 5/33* (2006.01)
*H04N 5/351* (2011.01)

(56) References Cited

U.S. PATENT DOCUMENTS

2014/0240721 A1 8/2014 Herschbach
2015/0378023 A1 12/2015 Royo Royo et al.
2021/0181013 A1\* 6/2021 Takeuchi ............. G02B 26/108

FOREIGN PATENT DOCUMENTS

JP 2005352080 A 12/2005
JP 2007183444 A 7/2007

\* cited by examiner

ELECTROMAGNETIC WAVE DETECTION APPARATUS AND INFORMATION ACQUISITION SYSTEM

CROSS REFERENCE TO RELATED APPLICATION

This application claims priority to and the benefit of Japanese Patent Application No. 2018-141272 filed on Jul. 27, 2018, the entire contents of which are incorporated herein by reference.

TECHNICAL FIELD

The present disclosure relates to an electromagnetic wave detection apparatus and an information acquisition system.

BACKGROUND

PTL 1 set forth below describes an apparatus that includes a prism for guiding a light flux incident from a lens system to a solid-state image sensor. This apparatus is provided with a light-shielding means that is arranged between the lens system and the prism and blocks light to be incident on the solid-state image sensor through a reflected optical path other than a reflected optical path set by the prism.

CITATION LIST

Patent Literature

PTL 1: JP-A-06-59195

SUMMARY

An electromagnetic wave detection apparatus according to an embodiment includes an image forming unit configured to form an image of incident electromagnetic waves, a prism having a first emission surface for emitting electromagnetic waves incident from the image forming unit, a progression unit that includes a plurality of pixels arranged along a reference surface and is configured to cause electromagnetic waves incident on the reference surface from the first emission surface to progress in a particular direction using each of the pixels, and a first detector configured to detect electromagnetic waves progressing in the particular direction. The prism includes a reflection suppressor that is provided at a position out of a progression path of electromagnetic waves incident from the image forming unit to be detected by the first detector and suppresses unnecessary light caused by end surface reflection of the prism from being incident on the first detector.

An information acquisition system according to an embodiment includes the electromagnetic wave detection apparatus described above and a controller configured to acquire information regarding the surroundings of the electromagnetic wave detection apparatus, based on a detection result of electromagnetic waves by the first detector.

Although the apparatus and the system have been described above as the solutions according to the present disclosure, it should be understood that a mode that include them can realize the present disclosure, or a method, a program, or a storage medium that stores a program substantially corresponding to them can realize the present disclosure and thus are included in the scope of the present disclosure.

DETAILED DESCRIPTION

In an apparatus that guides incident light to a detector such as a solid-state image sensor via a prism as described above, it is beneficial to reduce unnecessary light to be incident on the detector. According to an embodiment, unnecessary light to be incident on the detector can be reduced.

Hereinafter, embodiments of an electromagnetic wave detection apparatus and an information acquisition system, to which the present disclosure is applied, will be described with reference to the drawings.

In an electromagnetic wave detection apparatus that guides incident electromagnetic waves to a detector via a prism, surface reflection light caused by end surface reflection on an end surface of the prism may reach an image forming surface of the detector. When surface reflection light, which is unnecessary light, reaches the image forming surface of the detector, ghosts or flares generates, resulting in noises. Even if a light-shielding means is provided between a lens system and the prism as described in the PTL 1, it is difficult to suppress surface reflection light caused by end surface reflection of the prism to be incident on the detector.

Figure 1:
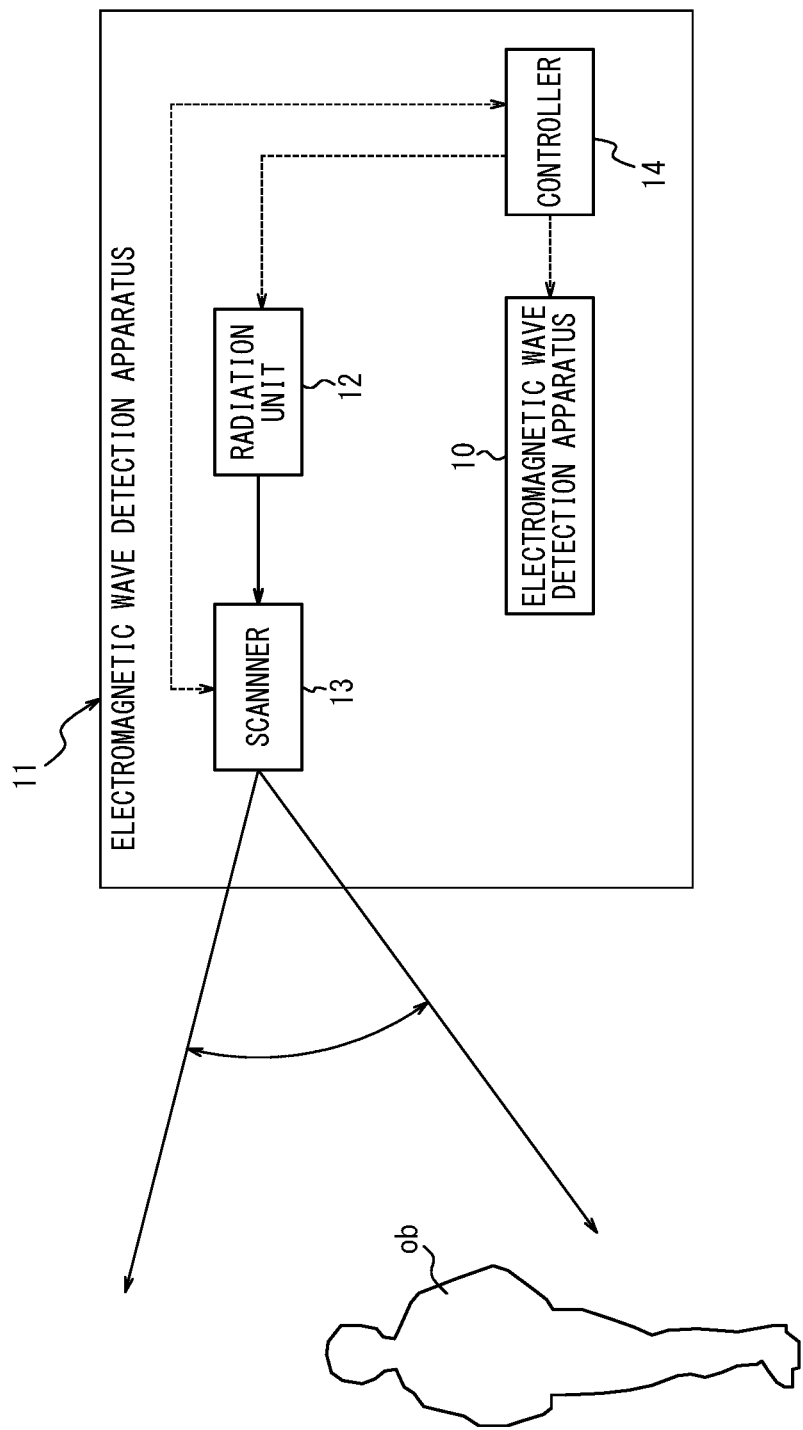
FIG. 1 is a diagram illustrating a schematic configuration of an information acquisition system that includes an electromagnetic wave detection apparatus according to a first embodiment of the present disclosure.

An information acquisition system 11 including an electromagnetic wave detection apparatus 10 according to a first embodiment of the present disclosure includes the electromagnetic wave detection apparatus 10, a radiation unit 12, a scanner 13, and a controller 14, as illustrated in FIG. 1. In FIG. 1, a broken line connecting each functional block indicates a flow of a control signal or communicated information. The communication indicated by the broken line may be wired communication or wireless communication. A solid line protruding from each functional block indicates a beam of electromagnetic waves.

The radiation unit 12 may radiate at least one of, for example, infrared rays, visible rays, ultraviolet rays, and radio waves. The radiation unit 12 may irradiate an object ob with electromagnetic waves, directly or indirectly via the scanner 13.

The radiation unit 12 may radiate a narrow beam of electromagnetic waves having a beam spread of, for example, 0.5°. The radiation unit 12 can radiate electromagnetic waves in pulses. For example, the radiation unit 12 includes, for example, an LED (Light Emitting Diode) or an LD (Laser Diode). The radiation unit 12 may switch between radiating and not radiating electromagnetic waves, based on control by the controller 14, as will be described below.

For example, the scanner 13 may include a reflector to reflect electromagnetic waves. The scanner 13 may change an irradiation location of electromagnetic waves to irradiate the object ob by reflecting electromagnetic waves radiated from the radiation unit 12 while changing the direction thereof. That is, the scanner 13 may scan the object ob using electromagnetic waves radiated from the radiation unit 12. The scanner 13 may scan the object ob in one-dimension or in two-dimensions.

The scanner 13 may be configured such that at least a portion of an irradiation region of electromagnetic waves that are radiated from the radiation unit 12 and reflected by the reflector is included in a detection region of electromagnetic waves in the electromagnetic wave detection apparatus 10. Thus, at least some of electromagnetic waves radiated to the object ob via the scanner 13 can be detected by the electromagnetic wave detection apparatus 10.

The scanner 13 includes, for example, a MEMS (Micro Electro Mechanical Systems) mirror, a polygon mirror, a galvano mirror, or the like.

The scanner 13 may change a reflection direction of electromagnetic waves, based on control by the controller 14, which will be described later. The scanner 13 may include an angle sensor such as, for example, an encoder. The scanner 13 may notify the controller 14 of an angle detected by the angle sensor as direction information associated with a direction to reflect electromagnetic waves. The controller 14 can calculate the irradiation location, based on the direction information acquired from the scanner 13. Alternatively, the controller 14 can calculate the irradiation location, based on a driving signal input to the scanner 13 to control the direction to reflect electromagnetic waves.

The electromagnetic wave detection apparatus 10 detects electromagnetic waves arriving from the object ob. For example, the electromagnetic wave detection apparatus 10 may detect electromagnetic waves emitted from the radiation unit 12 and reflected by the object ob. For example, the electromagnetic wave detection apparatus 10 may detect electromagnetic waves emitted by the object ob. The configuration of the electromagnetic wave detection apparatus 10 will be described later.

The controller 14 includes one or more processors and a memory. The processor may include a general purpose processor configured to read a specific program and perform a specific function, or a specialized processor dedicated for specific processing. The specialized processor may include an ASIC (Application Specific Integrated Circuit). The processor may include a PLD (Programmable Logic Device). The PLD may include an FPGA (Field-Programmable Gate Array).

The controller 14 may include at least one of a SoC (System-on-a-Chip) that includes one or more cooperating processors or a SiP (System in a Package).

The controller 14 may acquire information regarding the surroundings of the electromagnetic wave detection apparatus 10, based on a detection result of electromagnetic waves by the detector included in the electromagnetic wave detection apparatus 10, which will be described later. The information regarding the surroundings is, for example, image information, distance information, temperature information, or the like.

The controller 14 acquires the distance information using, for example, a ToF (Time-of-Flight) method. In particular, the controller 14 includes, for example, a time measurement LSI (Large Scale Integrated Circuit) and calculates a time ΔT from a time T1 at which the radiation unit 12 radiates electromagnetic waves to a time T2 at which the electromagnetic wave detection apparatus 10 detects reflected waves reflected at an irradiation position where the electromagnetic waves are radiated. The controller 14 calculates a distance to the irradiation position by multiplying the time ΔT by a speed of light and then dividing an acquired result by 2. The controller 14 calculates the irradiation position of electromagnetic waves, based on direction information acquired from the scanner 13 or a driving signal output to the scanner 13 by the controller 14. The controller 14 acquires the distance information in the form of an image by calculating a distance to each radiation position while changing the irradiation position of electromagnetic waves.

Although the information acquisition system 11 has been described in the present embodiment with reference to an example in which the distance information is acquired using the Direct ToF to directly calculate the time from radiation of electromagnetic waves to return of the electromagnetic waves, this is not restrictive. The information acquisition system 11 may acquire the distance information using Flash TOF to indirectly calculate the return time of electromagnetic waves from a phase difference between electromagnetic waves radiated at prescribed intervals and returned electromagnetic waves. The information acquisition system 11 may acquire the distance information using another ToF method such as, for example, Phased ToF.

Next, the configuration of the electromagnetic wave detection apparatus 10 according to the present embodiment will be described with reference to FIG. 2.

Figure 2:
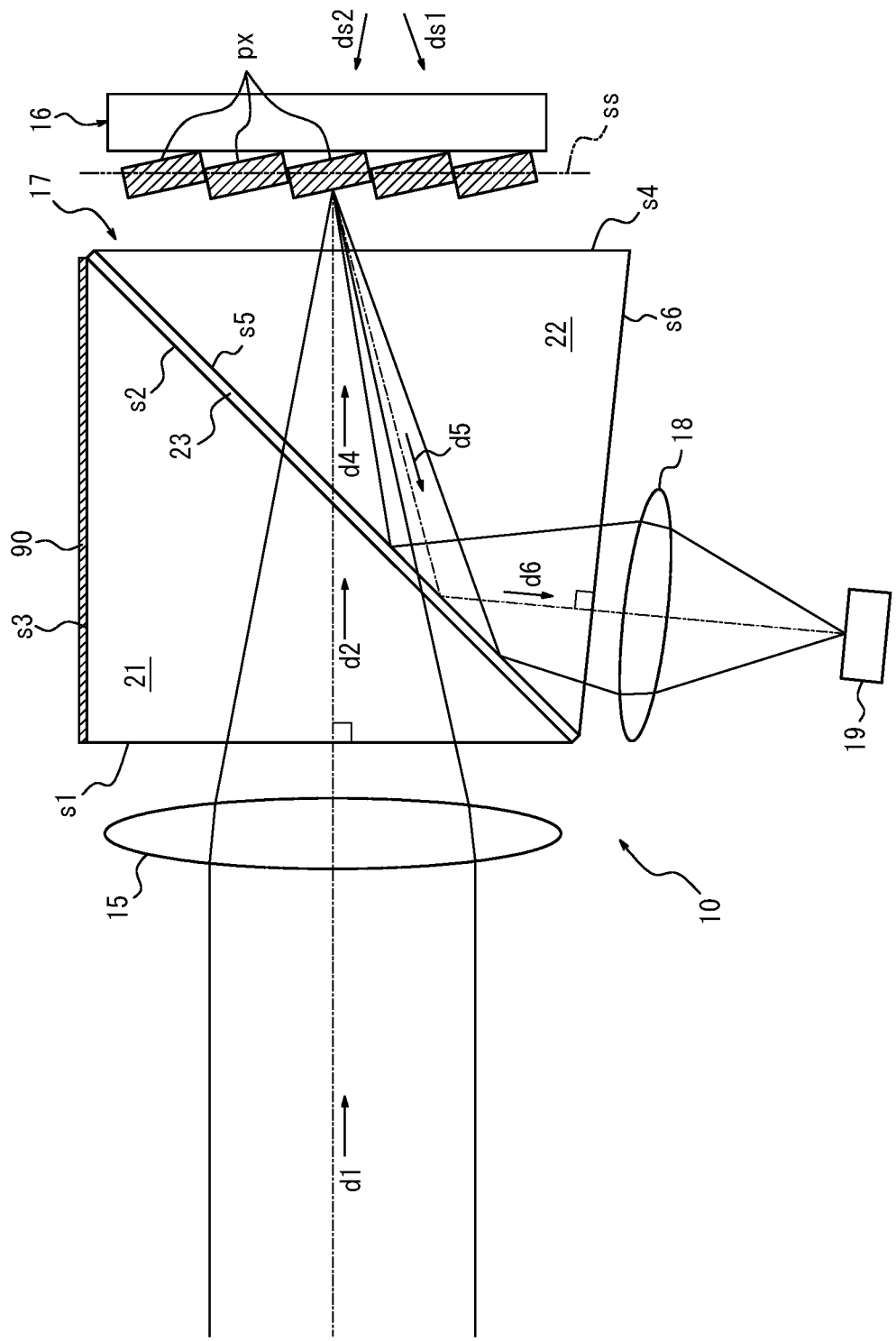
FIG. 2 is a diagram illustrating a schematic configuration of the electromagnetic wave detection apparatus illustrated in FIG. 1.

The electromagnetic wave detection apparatus 10 according to the present embodiment includes a first image forming unit 15, a progression unit 16, a prism 17, a second image forming unit 18, and a first detector 19, as illustrated in FIG. 2.

The first image forming unit 15 serving as an image forming unit includes, for example, at least one of a lens and a mirror. The first image forming unit 15 causes an image of electromagnetic waves of an object ob serving as a subject incident from a first direction d1 to progress to a first surface s1 of the prism 17 and to be formed at a location remote from the first surface s1. The first direction d1 is parallel to a principal axis of the first image forming unit 15 and includes a direction directed to the first image forming unit 15 from an object plane and a direction directed to an image plane from the first image forming unit 15.

The progression unit 16 is arranged in a path of electromagnetic waves emitted from a fourth surface s4 after being incident on the first surface s1 of the prism 17. The progression unit 16 may be provided at or in the vicinity of a primary imaging position of the object ob positioned remote from the first image forming unit 15 by a predetermined distance.

In FIG. 2, the progression unit 16 is provided at the primary imaging position of the object ob. The progression unit 16 contains a reference surface ss on which electromagnetic waves is to be incident after having passed through the first image forming unit 15 and the prism 17. The reference surface ss is a surface that causes an action such as, for example, reflection and transmission of electromagnetic waves in at least one of a first state and a second state, which will be described below. The progression unit 16 may form an image of electromagnetic waves of the object ob formed by the first image forming unit 15 on the reference surface ss. The reference surface ss may be perpendicular to a progression axis of electromagnetic waves emitted from the fourth surface s4.

The progression unit 16 causes electromagnetic waves incident on the reference surface ss to progress in a particular direction. The progression unit 16 includes a plurality of pixels px arranged along the reference surface. The progression unit 16 can switch between a first state in which electromagnetic waves are caused to progress in a first selection direction ds1 serving as the particular direction and a second state in which electromagnetic waves are caused to progress in a second selection direction ds2 serving as another particular direction, for each of the pixels px. The first state includes a first reflection state in which electromagnetic waves incident on the reference surface ss are reflected in the first selection direction ds1. The second state includes a second reflection state in which electromagnetic waves incident on the reference surface ss are reflected in a second selection direction ds2.

The progression unit 16 may include a reflection surface that reflects electromagnetic waves for each of the pixels px. The progression unit 16 may switch between the first reflection state and the second reflection state for each pixel px by changing an orientation of the reflection surface for each pixel px.

The progression unit 16 may include, for example, a digital micromirror device (DMD; Digital Micromirror Device). The DMD can drive minute reflection surfaces constituting the reference surface ss such that the reflection surface for each of the pixels px is inclined at +12° or −12° with respect to the reference surface ss. The reference surface ss may be parallel to a plate surface of the substrate including the minute reflection surfaces of the DMD mounted thereon.

The progression unit 16 may switch each of the pixels px between the first state and the second state, based on the control by the controller 14. For example, the progression unit 16 can switch some of the pixels px to the first state such that electromagnetic waves incident thereon are caused to progress in a first selection direction ds1. The progression unit 16 may also switch other pixels px to the second state such that electromagnetic waves incident thereon are caused to progress in a second selection direction ds2.

The prism 17 is arranged between the first image forming unit 15 and the progression unit 16. The prism 17 emits electromagnetic waves progressing from the first image forming unit 15 to the progression unit 16. The prism 17 also emits electromagnetic waves whose progression directions is changed by the progression unit 16 to the first detector 19. A detailed configuration of the prism 17 will be described below.

The prism 17 contains at least the first surface s1, a second surface s2, a third surface s3, the fourth surface s4, a fifth surface s5, and a sixth surface s6.

The first surface s1 causes electromagnetic waves incident on the prism 17 from the first direction d1 to progress in the second direction d2. The first surface s1 may be perpendicular to a progression axis of electromagnetic waves incident on the first surface s1 from the first direction d1. Because the first direction d1 is parallel to the principal axis of the first image forming unit 15 as described above, the principal axis of the first image forming unit 15 and the first surface s1 may be perpendicular to each other, in other words, a principal plane of the first image forming unit 15 and the first surface s1 may be parallel to each other. The first surface s1 may transmit or refract electromagnetic waves incident from the first direction d1 and cause the electromagnetic waves to progress in the second direction d2.

The second surface s2 causes electromagnetic waves progressing in the second direction d2 to progress in a fourth direction d4. The second surface s2 may cause electromagnetic waves in a particular wavelength band, from among electromagnetic waves progressing in the second direction d2, to progress in the fourth direction d4. The second surface s2 may transmit or refract electromagnetic waves in the particular wavelength band, from among electromagnetic waves progressing in the second direction d2, and cause the electromagnetic waves in the particular wavelength band to progress in the fourth direction d4. An incident angle of the electromagnetic waves progressing in the second direction d2 with respect to the second surface s2 may be smaller than a critical angle.

The third surface s3 intersects with the first surface s1 and the second surface s2.

The fourth surface s4 serving as a first emission surface emits electromagnetic waves progressing in the fourth direction d4 to the reference surface ss of the progression unit 16. Also, the fourth surface s4 causes electromagnetic waves re-incident from the reference surface ss of the progression unit 16 to progress in a fifth direction d5. The fourth surface s4 may be perpendicular to a progression axis of the electromagnetic waves progressing in the fourth direction d4, i.e., perpendicular to the fourth direction d4. The fourth surface s4 may transmit or refract electromagnetic waves re-incident from the reference surface ss and cause the electromagnetic waves to progress in the fifth direction d5.

The fifth surface s5 causes electromagnetic waves progressing in the fifth direction d5 to progress in a sixth direction d6. The fifth surface s5 may internally reflect the electromagnetic waves progressing in the fifth direction d5 and cause the electromagnetic waves to progress in the sixth direction d6. The fifth surface s5 may totally internally reflect the electromagnetic waves progressing in the fifth direction d5 and cause the electromagnetic waves to progress in the sixth direction d6. An incident angle of the electromagnetic waves progressing in the fifth direction d5 with respect to the fifth surface s5 may be equal to or larger than the critical angle. The incident angle of the electromagnetic waves progressing in the fifth direction d5 with respect to the fifth surface s5 may be different from the incident angle of electromagnetic waves progressing in the second direction d2 with respect to the second surface s2.

The incident angle of the electromagnetic waves progressing in the fifth direction d5 with respect to the fifth surface s5 may be larger than the incident angle of the electromagnetic waves progressing in the second direction d2 with respect to the second surface s2. The fifth surface s5 may be parallel to the second surface s2.

The sixth surface s6 serving as a second emission surface emits electromagnetic waves progressing in the sixth direction d6 serving as a first progression direction. The sixth surface s6 may be perpendicular to a progression axis of the electromagnetic waves progressing in the sixth direction d6, i.e., perpendicular to the sixth direction d6.

The prism 17 includes a first prism 21, a second prism 22, and a first intermediate layer 23.

The first prism 21 may contain the first surface s1, the second surface s2, and the third surface s3 as different surfaces. The first prism 21 may include, for example, a triangular prism. The first surface s1, the second surface s2, and the third surface s3 may intersect with one another.

The first prism 21 may be arranged such that the progression axis of electromagnetic waves incident on the first surface s1 from the first direction d1 is perpendicular to the first surface s1. The first prism 21 may be arranged such that the second surface s2 is positioned in a progression direction of electromagnetic waves progressing within the first prism 21 after being transmitted through or refracted by the first surface s1 from the first direction d1.

The second prism 22 may contain the fourth surface s4, the fifth surface s5, and the sixth surface s6 as different surfaces. The second prism 22 includes, for example, a triangular prism. The fourth surface s4, the fifth surface s5, and the sixth surface s6 may intersect with one another.

The second prism 22 may be arranged such that the fifth surface s5 is parallel to and opposes the second surface s2 of the first prism 21. The second prism 22 may be arranged such that the fourth surface s4 is positioned in a progression direction of electromagnetic waves progressing within the second prism 22 via the fifth surface s5 after being transmitted through the second surface s2 of the first prism 21. The second prism 22 may be arranged such that the sixth surface s6 is positioned in the sixth direction d6, which is a reflection angle equal to an incident angle of electromagnetic waves incident from the fifth direction d5 with respect to the fifth surface s5.

The first intermediate layer 23 may be arranged between the first prism 21 and the second prism 22. The first intermediate layer 23 may be in contact with the second surface s2 of the first prism 21 and may include the second surface s2 along the boundary surface with the first prism 21. The first intermediate layer 23 may be in contact with the fifth surface s5 of the second prism 22 and may include the fifth surface s5 along the boundary surface with the second prism 22. The first intermediate layer 23 includes, for example, a visible light reflective coating, a half mirror, a beam splitter, a dichroic mirror, a cold mirror, a hot mirror, a meta surface, or a deflection element, which is attached to the second surface s2.

A refractive index of the first intermediate layer 23 may be smaller than that of the second prism 22. Thus, electromagnetic waves that progress within the second prism 22 and is incident at an incident angle equal to or larger than the critical angle is totally internally reflected by the fifth surface s5. Accordingly, the fifth surface s5 internally reflects electromagnetic waves that progress having a progression axis in the fifth direction d5 within the second prism 22. In a configuration in which the incident angle of electromagnetic waves from the fifth direction d5 is equal to or larger than the critical angle, the fifth surface s5 totally internally reflects electromagnetic waves internally progressing in the fifth direction d5 and causes the electromagnetic waves to progress in the sixth direction d6.

The second image forming unit 18 may be provided on a path of electromagnetic waves that is emitted from the sixth surface s6 after progressing in the sixth direction d6. The second image forming unit 18 may be provided such that a principal plane thereof is parallel to the sixth surface s6. The second image forming unit 18 includes, for example, at least one of a lens and a mirror. The second image forming unit 18 may cause an image of the object ob as electromagnetic waves that have been primarily formed on the reference surface ss of the progression unit 16 and then emitted from the sixth surface s6 via the prism 17 to progress to the first detector 19 for image formation.

The first detector 19 detects electromagnetic waves caused to progress in the particular direction by the progression unit 16. In particular, the first detector 19 detects electromagnetic waves that have been caused to progress in the particular direction by the progression unit 16, caused to progress in the sixth direction d6 by the fifth surface s5, emitted from the sixth surface s6, and passed through the second image forming unit 18. That is, the first detector 19 detects electromagnetic waves emitted from the sixth surface s6 serving as the second emission surface after having been re-incident from the fourth surface s4 serving as the first emission surface and having progressed in the sixth direction d6 serving as the first progression direction. Because the first detector 19 detects electromagnetic waves emitted from the prism 17 after having been caused to progress in the particular direction by the progression unit 16 and re-incident on the prism 17, unnecessary light to be incident on the first detector 19 from the progression unit 16 can be reduced. To detect electromagnetic waves emitted from the sixth surface s6, the first detector 19 may be arranged on a path of electromagnetic waves that progresses via the second image forming unit 18 after being emitted from the sixth surface s6. The first detector 19 may be arranged at or in the vicinity of a secondary image forming position of an image of electromagnetic waves formed on the reference surface ss of the progression unit 16 by the second image forming unit 18.

The first detector 19 may be arranged such that a detection surface thereof is parallel to the sixth surface s6. As described above, the sixth surface s6 may be perpendicular to the progression axis of electromagnetic waves progressing in the sixth direction d6 and emitted. The detection surface of the first detector 19 may be perpendicular to the progression axis of electromagnetic waves emitted from the sixth surface s6. The detection surface of the first detector 19 may be parallel to a principal plane of the second image forming unit 18.

The first detector 19 may be an active sensor configured to detect electromagnetic waves reflected from the target ob after being radiated toward the object ob by the radiation unit 12. The first detector 19 may detect electromagnetic waves that are reflected from the object ob after being radiated by the radiation unit 12, reflected by the scanner 13, and then progress to the object ob.

The first detector 19 includes, in particular, an element constituting a distance measuring sensor. For example, the first detector 19 includes a single element such as an APD (Avalanche PhotoDiode), a PD (PhotoDiode), a SPAD (Single Photon Avalanche Diode), a millimeter wave sensor, a submillimeter wave sensor, or a ranging image sensor. The first detector 19 may include an element array such as an APD array, a PD array, an MPPC (Multi Photon Pixel Counter), a distance measuring imaging array, or a distance measuring image sensor. The first detector 19 may include at least one of the distance measuring sensor, an image sensor, and a temperature sensor.

The first detector 19 may transmit detection information indicating that reflected waves from the subject has been detected to the controller 14. The controller 14 acquires information regarding the surroundings of the electromagnetic wave detection apparatus 10, based on electromagnetic waves detected by the first detector 19. In particular, the controller 14 can acquire distance information of the irradiation position of electromagnetic waves radiated from the radiation unit 12 using, for example, the ToF method, based on the detection information transmitted from the first detector 19.

The first detector 19 composed of one element constituting the distance measuring sensor as described above simply needs to be able to detect electromagnetic waves and does not need to form an image on the detection surface. Thus, the first detector 19 does not necessarily need to be arranged at or in the vicinity of the second image forming location where an image is formed by the second image forming unit 18. In this configuration, that is, provided that electromagnetic waves from all angles of view can be incident on the detection surface of the first detector 19, the first detector 19 may be arranged at any location on the path of electromagnetic waves progressing via the second image forming unit 18 after being emitted from the sixth surface s6 of the prism 17.

In the present embodiment, the prism 17 includes a reflection suppressor 90 that suppresses unnecessary light, i.e., surface reflection light caused by end surface reflection on the end surface of the prism 17 from being incident on the first detector 19. The reflection suppressor 90 is provided at a position out of a progression path of electromagnetic waves incident from the first image forming unit 15 to be detected by the first detector 19. The electromagnetic waves to be detected by the first detector 19 are electromagnetic waves that are incident on the first detector 19 via the prism 17, the progression unit 16, and the second image forming unit 18 from the first image forming unit 15. That is, the progression path of electromagnetic waves to be detected by the first detector 19 is a light path set by the prism 17 in such a manner that electromagnetic waves incident from the first image forming unit 15 is incident on the first detector 19 via the prism 17, the progression unit 16, and the second image forming unit 18.

The reflection suppressor 90 is provided on the third surface s3 of the prism 17. As illustrated in FIG. 2, electromagnetic waves to be detected by the first detector 19 do not reach the third surface s3 of the prism 17. Thus, the reflection suppressor 90 is provided at a position out of the progression path of electromagnetic waves to be detected by the first detector 19. The reflection suppressor 90 may be provided on an interface between the prism 17 and another medium in contact with the prism 17 such as, for example, the atmosphere on the third surface s3 of the prism 17, that is, at a position out of the progression path of electromagnetic waves to be detected by the first detector 19. A distance from the progression path of electromagnetic waves to be detected by the first detector 19 to the interface on which the reflection suppressor 90 is provided may be equal to or longer than a predetermined distance to avoid hindering progression of electromagnetic waves to be detected by the first detector 19.

The reflection suppressor 90 is formed by the third surface s3 of the prism 17 used as an end surface reflection suppression surface constituted of a black-painted surface, a black-painted surface, a sand-sliding surface, a spherical surface, an aspherical surface, an uneven surface, or the like. By using the third surface s3 of the prism 17 as the end surface reflection suppression surface, end surface reflection on the third surface s3 can be suppressed. Because the third surface s3 provided with the reflection suppressor 90 suppresses the end surface reflection, the electromagnetic wave detection apparatus 10 according to the present embodiment can reduce unnecessary light to be incident on the first detector 19.

In the information acquisition system 11 according to the present embodiment, further, the controller 14 acquires the information regarding the surroundings of the electromagnetic wave detection apparatus 10, based on electromagnetic waves detected by the first detector 19. Thus, the information acquisition system 11 can provide useful information based on the detected electromagnetic waves. Such a configuration and effect is also applicable to an information acquisition system of each embodiment described later.

Figure 3:
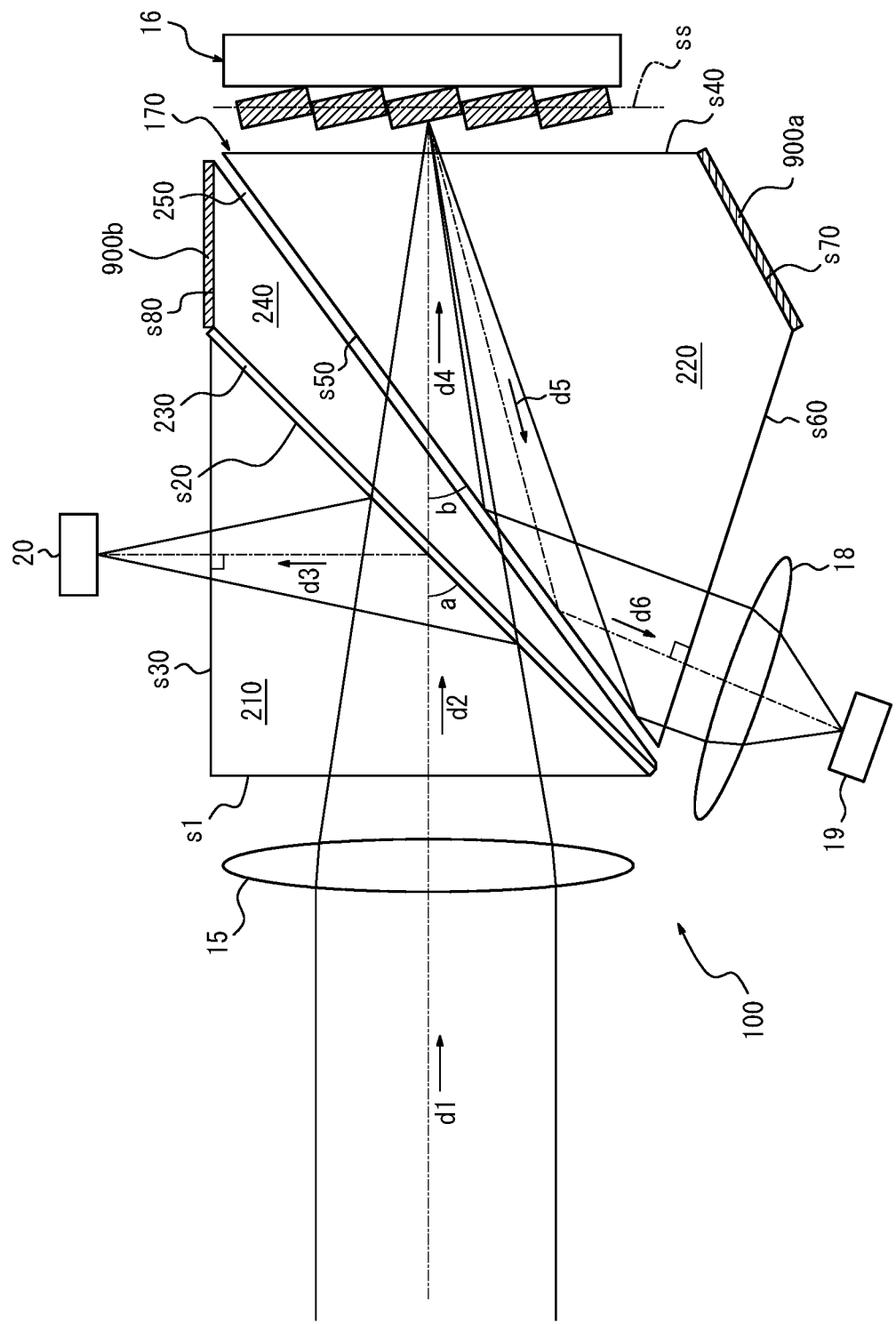
FIG. 3 is a diagram illustrating a schematic configuration of an electromagnetic wave detection apparatus according to a second embodiment of the present disclosure.

Next, an electromagnetic wave detection apparatus 100 according to a second embodiment of the present disclosure will be described with reference to FIG. 3. In FIG. 3, elements having the same configurations as those of the first embodiment are denoted by the same reference signs.

The electromagnetic wave detection apparatus 100 according to the present embodiment includes the first image forming unit 15, the progression unit 16, a prism 170, the second image forming unit 18, the first detector 19, and a second detector 20, as illustrated in FIG. 3. That is, the electromagnetic wave detection apparatus 100 according to the present embodiment is different from the electromagnetic wave detection apparatus 10 according to the first embodiment, in terms of including the prism 170 in place of the prism 17 and including the second detector 20 in addition.

The prism 170 contain at least a first surface s1, a second surface s20, a third surface s30, a fourth surface s40, a fifth surface s50, and a sixth surface s60. A function of the fourth surface s40 is the same as that of the fourth surface s4. A function of the sixth surface s60 is the same as that of the sixth surface s6.

The second surface s20 separates electromagnetic waves progressing in the second direction d2 and into electromagnetic waves to progress in the third direction d3 and electromagnetic waves to progress in the fourth direction d4. The prism 170 may separate electromagnetic waves progressing in the second direction d2 into electromagnetic waves to progress in the third direction d3 and electromagnetic waves to progress in the fourth direction d4.

The second surface s20 may cause electromagnetic waves in a particular wavelength band, from among electromagnetic waves progressing in the second direction d2, to progress in the third direction d3 and cause electromagnetic waves in another wavelength band to progress in the fourth direction d4. The second surface s20 may reflect electromagnetic waves in the particular wavelength band, from among electromagnetic waves progressing in the second direction d2, and cause the electromagnetic waves to progress in the third direction d3, and transmit or refract electromagnetic waves in another wavelength band and cause the electromagnetic waves to progress in the fourth direction d4. The second surface s20 may totally reflect electromagnetic waves in the particular wavelength band, from among electromagnetic waves progressing in the second direction d2, and cause the electromagnetic waves to progress in the third direction d3, and transmit or refract electromagnetic waves in another wavelength band and cause the electromagnetic waves to progress in the fourth direction d4. That is, the prism 170 may reflect electromagnetic waves in the particular wavelength band and cause the electromagnetic waves to progress in the third direction d3 serving as a third progression direction, and cause electromagnetic waves in another wavelength band to progress in the fourth direction d4 serving as a second progression direction. An incident angle of electromagnetic waves progressing in the second direction d2 with respect to the second surface s20 may be smaller than the critical angle.

The third surface s30 serving as a third emission surface emits electromagnetic waves progressing in the third direction d3. That is, the prism 170 contains the third surface s30 serving as the third emission surface for emitting electromagnetic waves progressing in the third direction d3. The third surface s30 may be perpendicular to a progression axis of electromagnetic waves progressing in the third direction d3, that is, perpendicular to the third direction d3.

The fifth surface s50 causes electromagnetic waves progressing in the fifth direction d5 to progress in the sixth direction d6, in a manner similar to the first embodiment. The fifth surface s50 may internally reflect electromagnetic waves progressing in the fifth direction d5 and cause the electromagnetic waves to progress in the sixth direction d6, in a manner similar to the first embodiment. The fifth surface s50 may totally internally reflect electromagnetic waves progressing in the fifth direction d5 and cause the electromagnetic waves to progress in the sixth direction d6, in a manner similar to the first embodiment. An incident angle of electromagnetic waves progressing in the fifth direction d5 with respect to the fifth surface s50 may be equal to or larger than the critical angle, in a manner similar to the first embodiment. The incident angle of electromagnetic waves progressing in the fifth direction d5 with respect to the fifth surface s50 may be different from the incident angle of electromagnetic waves progressing in the second direction d2 with respect to the second surface s20, in a manner similar to the first embodiment. The incident angle of electromagnetic waves progressing in the fifth direction d5 with respect to the fifth surface s50 may be larger than the incident angle of electromagnetic waves progressing in the second direction d2 with respect to the second surface s20, in a manner similar to the first embodiment. The fifth surface s50 does not need to be parallel to the second surface s20, in a manner different from the first embodiment.

The prism 170 contains a first prism 210, a second prism 220, a third prism 240, a first intermediate layer 230, and a second intermediate layer 250.

The first prism 210 may contain a first surface s1, a second surface s20, and a third surface s30 as different surfaces. The first prism 210 includes, for example, a triangular prism. The first surface s1, the second surface s20, and the third surface s30 may intersect with one another.

The second prism 220 may contain a fourth surface s40, a fifth surface s50, a sixth surface s60, and a seventh surface s70 as different surfaces. The seventh surface s70 may intersect with the fourth surface s40 and the sixth surface s60.

The second prism 220 may be arranged such that the fourth surface s40 is positioned in a progression direction of electromagnetic waves that progresses within the second prism 220 via the fifth surface s50 after being transmitted through the second surface s20 of the first prism 210, in a manner similar to the first embodiment. The second prism 220 may be arranged such that the sixth surface s60 is positioned in the sixth direction d6, which is a reflection angle equal to the incident angle of electromagnetic waves from the fifth direction d5 with respect to the fifth surface s50, in a manner similar to the first embodiment. The second prism 220 may be arranged such that an angle b formed by the second direction d2 and the fifth surface s50 is smaller than an angle a formed by the second direction d2 and the second surface s20, in a manner different from the first embodiment.

The third prism 240 may be arranged between the first intermediate layer 230 and the second intermediate layer 250. One slope of the third prism 240 may be in contact with the first intermediate layer 230. Another slope of the third prism 240 may be in contact with the second intermediate layer 250. The third prism 240 may contain the one slope in contact with the first intermediate layer 230, the another slope in contact with the second intermediate layer 250, and an eighth surface s80 intersecting with the one slope and the another slope, as different surfaces. The third prism 240 includes, for example, a triangular prism.

The first intermediate layer 230 may be arranged between the first prism 210 and the third prism 240. The first intermediate layer 230 may be in contact with the second surface s20 of the first prism 210 and may include the second surface s20 along the boundary surface with the first prism 210. The first intermediate layer 230 includes, for example, a visible light reflective coating, a half mirror, a beam splitter, a dichroic mirror, a cold mirror, a hot mirror, a meta surface, or a deflecting element, which is attached to the second surface s20.

The second intermediate layer 250 may be arranged between the second prism 220 and the third prism 240. The second intermediate layer 250 may be in contact with the fifth surface s50 of the second prism 220 and may include the fifth surface s50 along the boundary surface with the second prism 220.

A refractive index of the second intermediate layer 250 may be smaller than that of the second prism 220. The second intermediate layer 250 includes, for example, at least one of vacuum, a gas, a liquid, and a solid, which has a refractive index smaller than that of the second prism 220. Thus, electromagnetic waves progressing within the second prism 220 and is incident at an incident angle equal to or larger than the critical angle are totally internally reflected on the fifth surface s50.

Accordingly, the fifth surface s50 internally reflects electromagnetic waves progressing in the fifth direction d5 within the second prism 220. In a configuration in which the incident angle of electromagnetic waves from the fifth direction d5 is equal to or larger than the critical angle, the fifth surface s50 totally internally reflects electromagnetic waves progressing in the fifth direction d5 within the second prism 220 and causes the electromagnetic waves to progress in the sixth direction d6. In a configuration in which the second intermediate layer 250 is a gas or a liquid, the second intermediate layer 250 may be formed by providing spacers on the respective peripheries of the first another slope of the third prism 240 and the fifth surface s50 of the second prism 220 and filling the spacers with a gas or a liquid.

The second detector 20 detects electromagnetic waves emitted from the third surface s30. To detect electromagnetic waves emitted from the third surface s30, the second detector 20 may be provided on a path of electromagnetic waves emitted in the third direction d3 from the prism 170. The second detector 20 may be provided at or in the vicinity of the image forming position of the object ob by the first image forming unit 15 in the third direction d3 from the prism 170.

Thus, an image of electromagnetic waves of the object ob that reaches the detection surface of the second detector 20 via the second surface s20 and the third surface s30 may be formed. A difference between a length of the progression path of electromagnetic waves progressing in the third direction d3 from the second surface s20 to the second detector 20 and a length of a progression path of electromagnetic waves progressing in the fourth direction d4 from the second surface s20 to the reference surface ss may be equal to or smaller than a predetermined value and, further, may be equal to each other.

The second detector 20 may be arranged such that the detection surface thereof is parallel to the third surface s30. As described above, the third surface s30 may be perpendicular to the progression axis of electromagnetic waves progressing in the third direction d3 and emitted. The detection surface of the second detector 20 may be perpendicular to a progression axis of electromagnetic waves emitted from the third surface s30.

The second detector 20 includes a passive sensor. The second detector 20 includes, in particular, an element array. For example, the second detector 20 may include an image sensor or an imaging array, capture an image of electromagnetic waves formed on the detection surface, and generate image information corresponding to the captured object ob. The second detector 20 may capture an image of visible light. The second detector 20 may transmit the generated image information to the controller 14. The controller 14 acquires information regarding the surroundings of the electromagnetic wave detection apparatus 100, based on the detection result of electromagnetic waves by the second detector 20.

The second detector 20 may capture an image of infrared light, ultraviolet, radio waves, or the like rather than an image of visible light. The second detector 20 may include a distance measuring sensor. In this configuration, the electromagnetic wave detection apparatus 100 can acquire distance information in the form of an image using the second detector 20. The second detector 20 may include a distance measuring sensor, a temperature sensor, or the like. In this configuration, the electromagnetic wave detection apparatus 100 can acquire temperature information in the form of an image using the second detector 20.

The second detector 20 may include a sensor of a different type or the same type as that of the first detector 19. The second detector 20 may detect electromagnetic waves of a different type or the same type as electromagnetic waves detected by the first detector 19.

In the present embodiment, the prism 170 includes a reflection suppressor 900a and a reflection suppressor 900b. The reflection suppressor 900a is provided on the seventh surface s70 of the second prism 220. The reflection suppressor 900b is provided on the eighth surface s80 of the third prism 240. Electromagnetic waves to be detected by the first detector 19 and the second detector 20 do not reach the seventh surface s70 provided with the reflection suppressor 900a and the eighth surface s80 provided with the reflection suppressor 900b, as illustrated in FIG. 3. That is, the reflection suppressors 900a and 900b are provided at the respective positions out of the progression paths of the electromagnetic waves to be detected by the first detector 19 and the second detector 20. The reflection suppressor 900a is formed by using the seventh surface s70 as the end surface reflection suppression surface. The reflection suppressor 900b is formed by using the eighth surface s80 as the end surface reflection suppression surface. By using the seventh surface s70 and the eighth surface s80 as the end surface reflection suppression surfaces, end surface reflection on these surfaces can be suppressed. Accordingly, the electromagnetic wave detection apparatus 100 according to the present embodiment can suppress end surface reflection on the seventh surface s70 and the eighth surface s80 and reduce unwanted light to be incident on the first detector 19 and the second detector 20.

Figure 4:
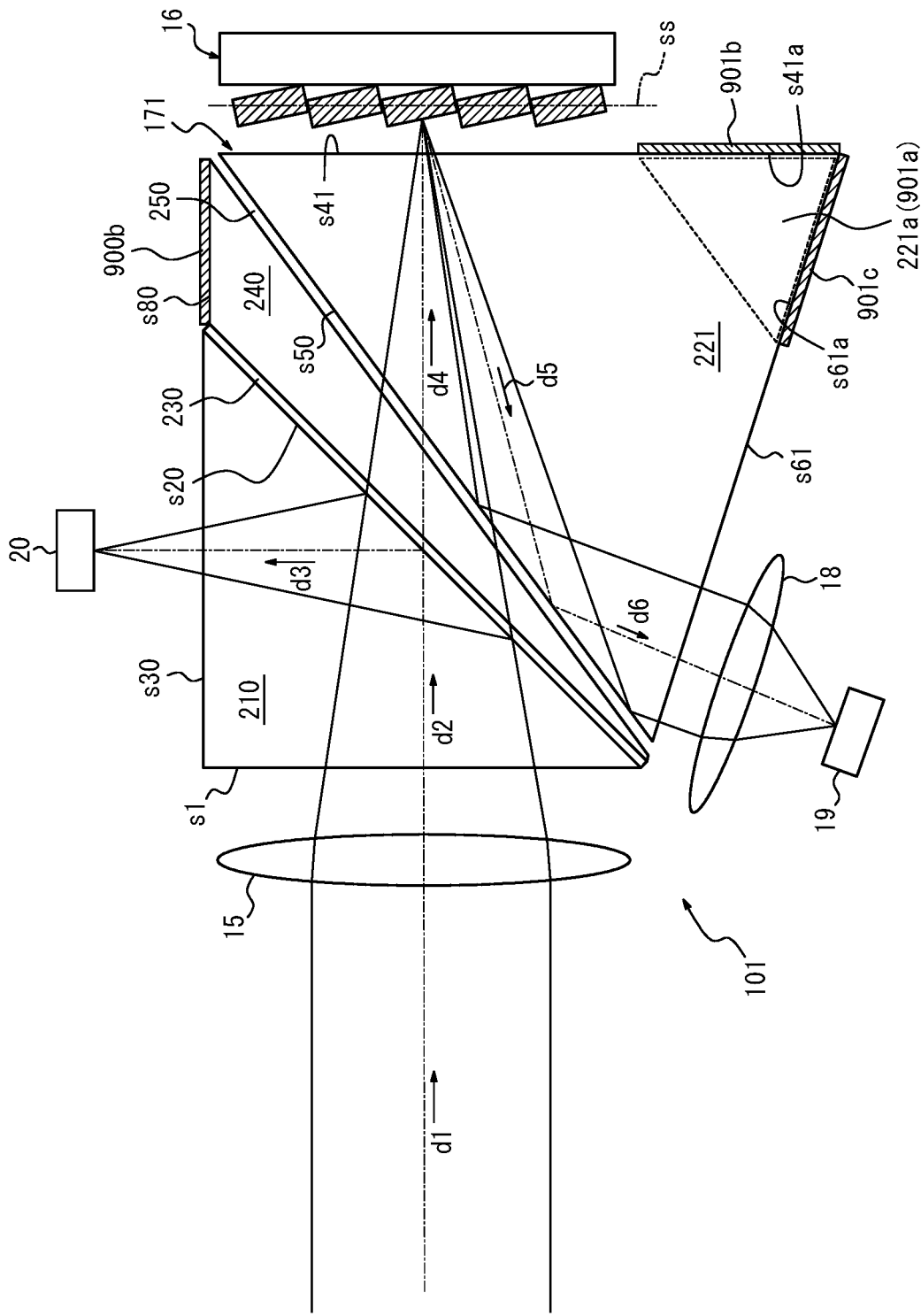
FIG. 4 is a diagram illustrating a schematic configuration of an electromagnetic wave detection apparatus according to a third embodiment of the present disclosure.

Next, an electromagnetic wave detection apparatus 101 according to a third embodiment of the present disclosure will be described with reference to FIG. 4. In FIG. 4, elements having the same configurations as those of each of the embodiments described above are denoted by the same reference signs.

The electromagnetic wave detection apparatus 101 according to the present embodiment includes the first image forming unit 15, the progression unit 16, a prism 171, the second image forming unit 18, the first detector. 19, and the second detector 20, as illustrated in FIG. 4. That is, the electromagnetic wave detection apparatus 101 according to the present embodiment is different from the electromagnetic wave detection apparatus 100 according to the second embodiment, in terms of including the prism 171 in place of the prism 170. The configuration and function of the information acquisition system 11 according to the third embodiment other than the electromagnetic wave detection apparatus 101 are the same as those of the second embodiment.

The prism 171 includes a first prism 210, a second prism 221 a third prism 240, a first intermediate layer 230, and a second intermediate layer 250. That is, the prism 171 of the present embodiment is different from the prism 170 of the second embodiment, in terms of including the second prism 221 in place of the second prism 220.

The second prism 221 may contain a fourth surface s41, a fifth surface s50, and a sixth surface s61 as different surfaces. The second prism 221 includes, for example, a triangular prism. The fourth surface s41, the fifth surface s50, and the sixth surface s61 may intersect with one another.

The function of the fourth surface s41 is the same as that of the fourth surface s40 of the prism 170. The function of the sixth surface s61 is the same as that of the sixth surface s60 of the prism 170. A configuration of the fourth surface s41 is different from that of the fourth surface s40 of the prism 170. A configuration of the sixth surface s61 is different from that of the sixth surface s60 of the prism 170.

In the prism 170, the fourth surface s40 and the seventh surface s70 intersect with each other, and the sixth surface s60 and the seventh surface s70 intersect with each other. In the prism 171, on the other hand, the fourth surface s41 extends longer than the fourth surface s40 in a direction opposite to a line of intersection of the fourth surface s41 and the fifth surface s50, as illustrated in FIG. 4. Further, the sixth surface s61 extends longer than the sixth surface s60 in a direction opposite to a line of intersection of the sixth surface s61 and the fifth surface s50. Because the fourth surface s41 and the sixth surface s61 extend, the fourth surface s41 and the sixth surface s61 intersect with each other.

Because the fourth surface s41 and the sixth surface s61 extend and intersect with each other, the second prism 221 is expanded by the size of a region 221a and larger than the second prism 220. As illustrated in FIG. 4, the region 221a is positioned out of progression paths of electromagnetic waves to be detected by the first detector 19 and the second detector 20 after being incident from the first image forming unit 15. Also, distances from the region 221*a* to the progression paths of electromagnetic waves, e.g., a progression path of electromagnetic waves progressing in the fifth direction d5 and a progression path of electromagnetic waves progressing in the sixth direction d6 are equal to or longer than a predetermined distance. Thus, even if end surface reflection occurs in the region 221*a*, surface reflection light is suppressed from reaching the first detector 19 and the second detector 20. Accordingly, the region 221*a* functions as a reflection suppressor 901*a* that suppresses surface reflection light caused by the end surface reflection of the prism 171, which is unnecessary light, from being incident on the first detector 19 and the second detector 20.

In the fourth surface s41, a surface s41*a* corresponding to the region 221*a* is provided with the reflection suppressor 901*b*. The reflection suppressor 901*b* is formed by using the surface s41*a* as the end surface reflection suppression surface. Further, in the sixth surface s61, the surface s61*a* corresponding to the region 221*a* is provided with a reflection suppressor 901*c*. The reflection suppressor 901*c* is formed by using the surface s61*a* as the end surface reflection suppression surface. By providing the reflection suppressor 901*b* on the surface s41*a* and providing the reflection suppressor 901*c* on the surface s61*a*, end surface reflection on the surface s41*a* and the surface s61 is suppressed.

In the present embodiment, as described above, the prism 171 includes the region 221*a* that functions as the reflection suppressor 901*a* and is provided at a position out of the progression paths of electromagnetic waves to be detected by the first detector 19 and the second detector 20 after being incident from the first image forming unit 15. Preferably, the region 221*a* is positioned at a distance equal to or longer than the predetermined distance from the progression paths of electromagnetic waves to be detected by the first detector 19 and the second detector 20. In this configuration, even if end surface reflection occurs in the region 221*a* of the prism 171, surface reflection light is suppressed from being incident on the first detector 19 and the second detector 20. Accordingly, the electromagnetic wave detection apparatus 101 according to the present embodiment can reduce unnecessary light to be incident on the first detector 19 and the second detector 20.

Figure 5:
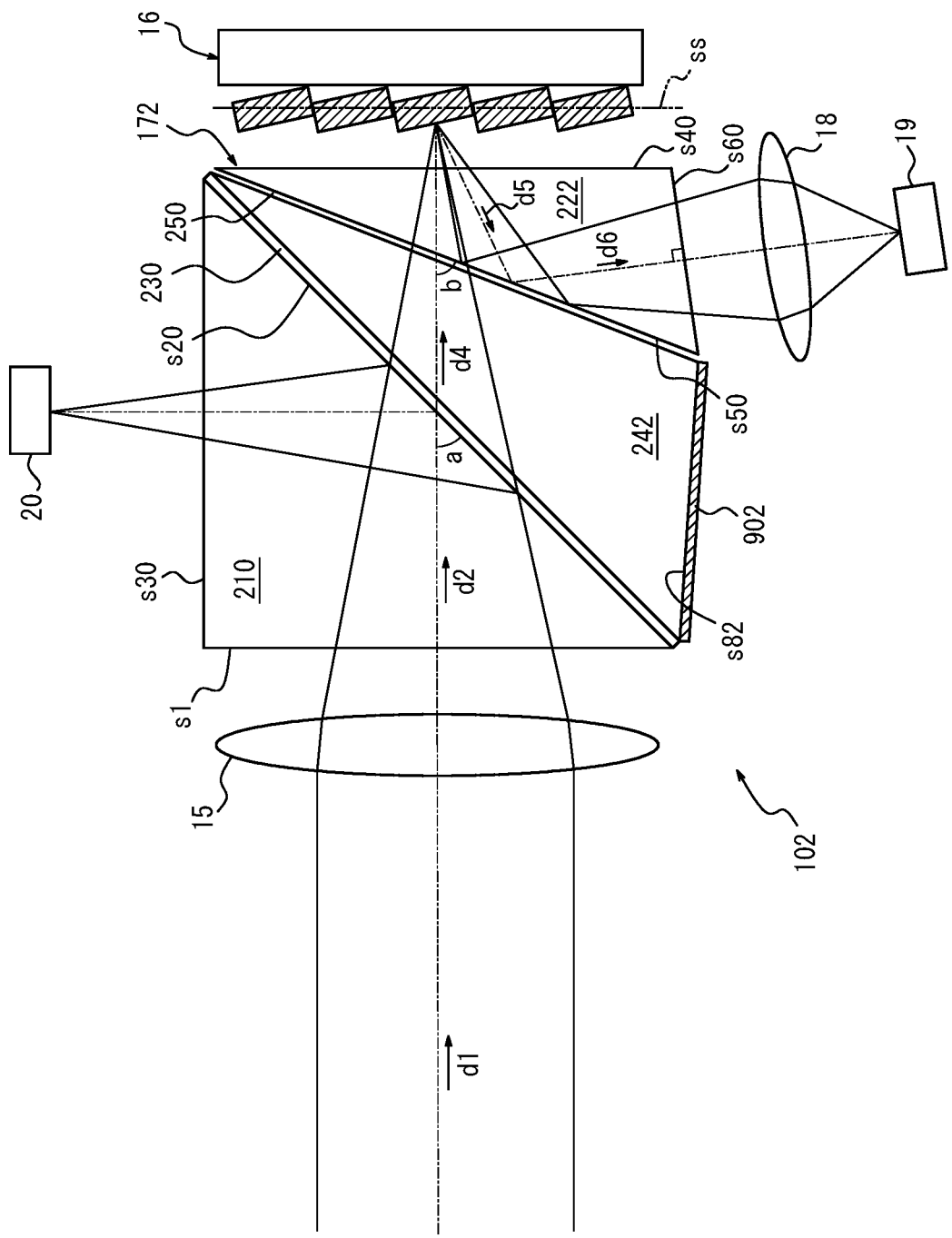
FIG. 5 is a diagram illustrating a schematic configuration of an electromagnetic wave detection apparatus according to a fourth embodiment of the present disclosure.

Next, an electromagnetic wave detection apparatus 102 according to a fourth embodiment of the present disclosure will be described with reference to FIG. 5. In FIG. 5, elements having the same configurations as those of each of the embodiments described above are denoted by the same reference signs.

The electromagnetic wave detection apparatus 102 according to the present embodiment includes the first image forming unit 15, the progression unit 16, a prism 172, the second image forming unit 18, the first detector 19, and the second detector 20, as illustrated in FIG. 5. That is, the electromagnetic wave detection apparatus 102 according to the present embodiment is different from the electromagnetic wave detection apparatus 100 according to the second embodiment, in terms of including the prism 172 in place of the prism 170. The configuration and function of the information acquisition system 11 according to the present embodiment other than the electromagnetic wave detection apparatus 102 are the same as those of the second embodiment.

The prism 172 contain at least a first surface s1, a second surface s20, a third surface s30, a fourth surface s40, a fifth surface s50, and a sixth surface s60. The configurations and functions of these surfaces are the same as those of the second embodiment.

The prism 172 includes a first prism 210, a second prism 222, a third prism 242, a first intermediate layer 230, and a second intermediate layer 250.

The second prism 222 may contain a fourth surface s40, a fifth surface s50, and a sixth surface s60 as different surfaces. The second prism 222 includes, for example, a triangular prism. The fourth surface s40, the fifth surface s50, and the sixth surface s60 may intersect with each other.

The second prism 222 may be arranged such that the fourth surface s40 is positioned in a progression direction of electromagnetic waves progressing within the second prism 222 via the fifth surface s50 after being transmitted through the second surface s20 of the first prism 210, in a manner similar to the second embodiment. The second prism may be arranged such that the sixth surface s60 is arranged in the sixth direction d6, which is a reflection angle equal to the incident angle of electromagnetic waves from the fifth direction d5 with respect to the fifth surface s50, in a manner similar to the first embodiment. The second prism 222 may arranged such that an angle b formed by the second direction d2 and the fifth surface s50 is larger than an angle a formed by the second direction d2 and the second surface s20, in a manner different from the second embodiment.

The third prism 242 may be arranged between the first intermediate layer 230 and the second intermediate layer 250. One slope of the third prism 242 may be in contact with the first intermediate layer 230. Another slope of the third prism 242 may be in contact with the second intermediate layer 250. The third prism 242 may contain the one slope in contact with the first intermediate layer 230, the another slope in contact with the second intermediate layer 250, and an eighth surface s82 intersecting with the one slope and the another slope, as different surfaces. The third prism 242 includes, for example, a triangular prism.

In the present embodiment, the prism 172 includes a reflection suppressor 902. The reflection suppressor 902 is provided on the eighth surface s82 of the third prism 242. Electromagnetic waves to be detected by the first detector 19 and the second detector 20 do not reach the eighth surface s82 provided with the reflection suppressor 902, as illustrated in FIG. 5. Thus, the reflection suppressor 902 is provided at a position out of progression paths of electromagnetic waves to be detected by the first detector 19 and the second detector 20. The reflection suppressor 902 is formed by using the eighth surface s82 as the end surface reflection suppression surface. By using the eighth surface s82 as the end surface reflection suppression surface, end surface reflection on the eighth surface s82 can be suppressed. Thus, the electromagnetic wave detection apparatus 102 according to the present embodiment can suppress end surface reflection on the eighth surface s82 and reduce unnecessary light to be incident on the first detector 19 and the second detector 20.

Figure 6:
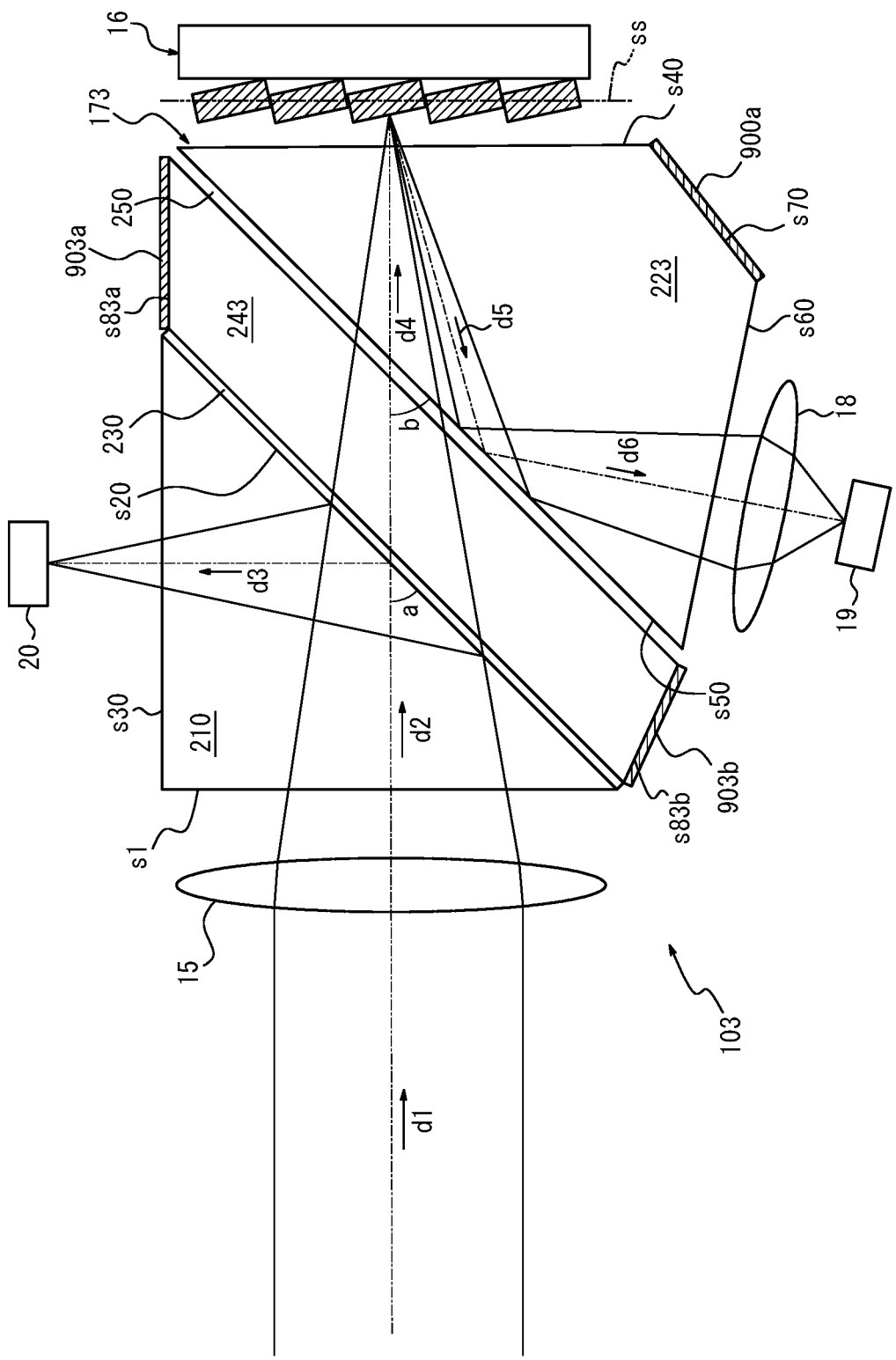
FIG. 6 is a diagram illustrating a schematic configuration of an electromagnetic wave detection apparatus according to a fifth embodiment of the present disclosure.

Next, an electromagnetic wave detection apparatus 103 according to a fifth embodiment of the present disclosure will be described with reference to FIG. 6. In FIG. 6, elements having the same configurations as those of each of the embodiments described above are denoted by the same reference signs.

The electromagnetic wave detection apparatus 103 according to the present embodiment includes the first image forming unit 15, the progression unit 16, a prism 173, the second image forming unit 18, the first detector 19, and the second detector 20, as illustrated in FIG. 6. That is, the electromagnetic wave detection apparatus 103 according to the present embodiment is different from the electromagnetic wave detection apparatus 100 according to the second embodiment, in terms of including the prism 173 in place of the prism 170. In the information acquisition system 11 according to the fifth embodiment, the configurations and functions other than the electromagnetic wave detection apparatus 103 are the same as those of the second embodiment.

The prism 173 contain at least a first surface s1, a second surface s20, a third surface s30, a fourth surface s40, a fifth surface s50, and a sixth surface s60. The configurations and functions of these surfaces are the same as those of the second embodiment.

The prism 173 includes a first prism 210, a second prism 223, a third prism 243, a first intermediate layer 230, and a second intermediate layer 250.

The second prism 223 may contain the fourth surface s40, the fifth surface s50, the sixth surface s60, and a seventh surface s70 as different surfaces. The seventh surface s70 may intersect with the fourth surface s40 and the sixth surface s60. The seventh surface s70 is provided with a reflection suppressor 900a, in a manner similar to the second embodiment.

The second prism 223 may be arranged in a manner similar to the second embodiment such that the fourth surface s40 is positioned in a progression direction of electromagnetic waves that progress within the second prism 220 via the fifth surface s50 after being transmitted through the second surface s20 of the first prism 210. The second prism 223 may be arranged in a manner similar to the second embodiment such that the sixth surface s60 is arranged in the sixth direction d6, which is a reflection angle equal to the incident angle of electromagnetic waves from the fifth direction d5 with respect to the fifth surface s50. The second prism 223 may be arranged in a manner different from the second embodiment such that an angle a formed by the second direction d2 and the second surface s20 and an angle b formed by the second direction d2 and the fifth surface s50 are equal to each other.

A third prism 243 may be arranged between the first intermediate layer 230 and the second intermediate layer 250. The third prism 243 may contain a plate-like shape. One plate surface of the third prism 243 may be in contact with the first intermediate layer 230. The other plate surface of the third prism 243 may be in contact with the second intermediate layer 250. The third prism 243 may contain an eighth surface s83a that intersects with one end of the one plate surface and one end of the other plate surface, and an eighth surface s83b that intersects with the other end of the one plate surface and the other end of the other plate surface.

In the present embodiment, the prism 173 includes a reflection suppressor 903a and a reflection suppressor 903b, in addition to the reflection suppressor 900a. The reflection suppressor 903a is provided on the eighth surface s83a of the third prism 243. The reflection suppressor 903b is provided on the eighth surface s83b of the third prism 243. Electromagnetic waves to be detected by the first detector 19 and the second detector 20 do not reach the eight surface s83a provided with the reflection suppressor 903a and the eighth surface s83b provided with the reflection suppressor 903b, as illustrated in FIG. 6. Thus, the reflection suppressors 903a and 903b are provided at positions out of progression paths of electromagnetic waves to be detected by the first detector 19 and the second detector 20. The reflection suppressor 903a is formed by using the eighth surface s83a as an end surface reflection suppression surface. The reflection suppressor 903b is formed by using the eighth surface 83b as an end surface reflection suppression surface. By using the eighth surface s83a and the eighth surface s83b as the end surface reflection suppression surfaces, end surface reflection on these surfaces can be suppressed. Accordingly, the electromagnetic wave detection apparatus 103 according to the present embodiment can suppress end surface reflection on the eighth surface s83a and the eighth surface s83b and reduce unwanted light to be incident on the first detector 19 and the second detector 20.

Figure 7:
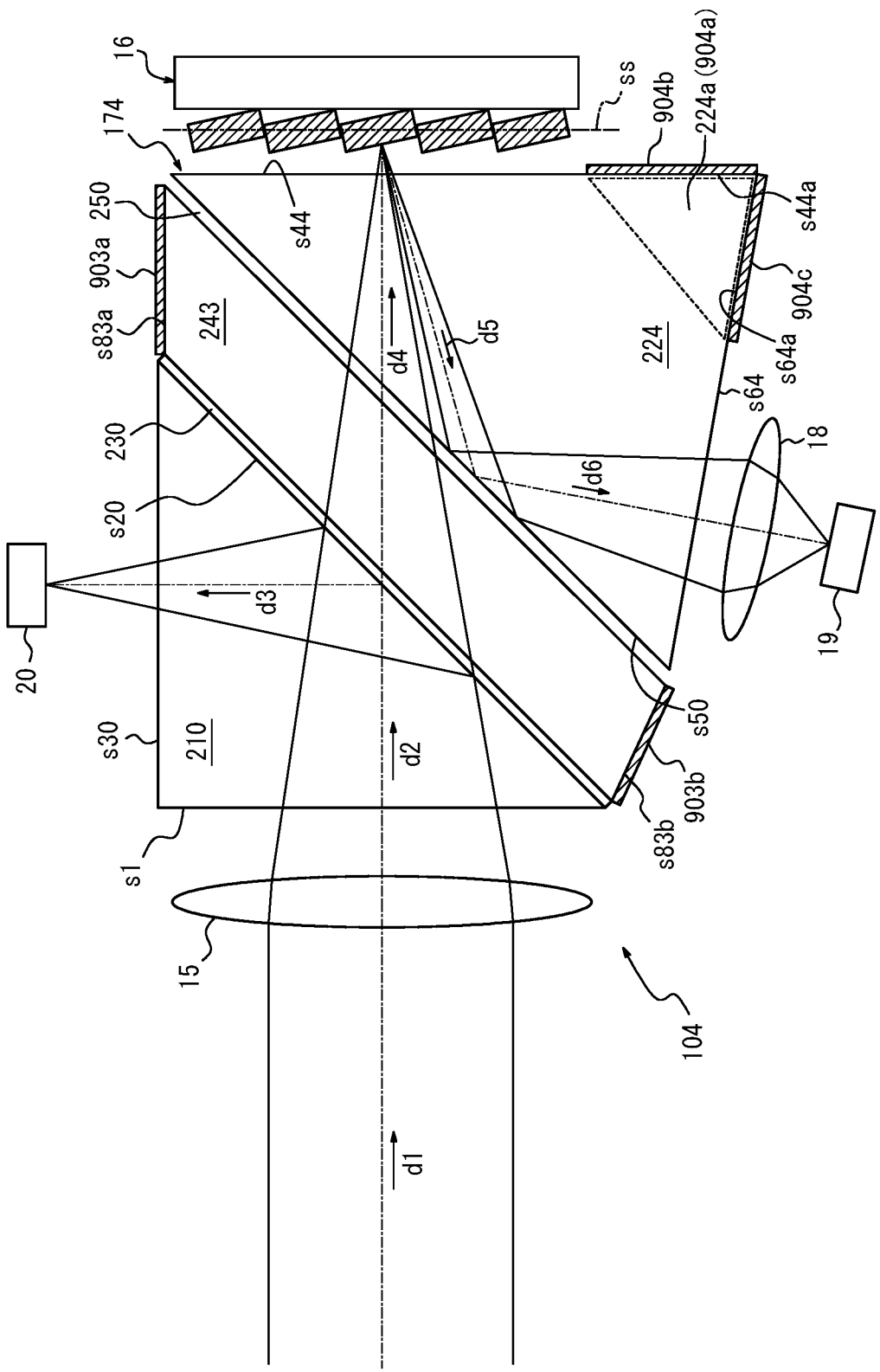
FIG. 7 is a diagram illustrating a schematic configuration of an electromagnetic wave detection apparatus according to a sixth embodiment of the present disclosure.

Next, an electromagnetic wave detection apparatus 104 according to a sixth embodiment of the present disclosure will be described with reference to FIG. 7. In FIG. 7, elements having the same configurations as those of the embodiments described above are denoted by the same reference signs.

The electromagnetic wave detection apparatus 104 according to the present embodiment includes the first image forming unit 15, the progression unit 16, a prism 174, the second image forming unit 18, the first detector 19, and the second detector 20, as illustrated in FIG. 7. That is, the electromagnetic wave detection apparatus 104 according to the present embodiment is different from the electromagnetic wave detection apparatus 100 according to the second embodiment, in terms of including the prism 174 in place of the prism 170. The configuration and function of the information acquisition system 11 according to the present embodiment other than the electromagnetic wave detection apparatus 104 are the same as those of the second embodiment.

The prism 174 includes a first prism 210, a second prism 224, a third prism 243, a first intermediate layer 230, and a second intermediate layer 250.

The second prism 224 may contain a fourth surface s44, a fifth surface s50, and a sixth surface s64 as different surfaces. The second prism 224 includes, for example, a triangular prism. The fourth surface s44, the fifth surface s50, and the sixth surface s64 may intersect with one another.

The function of the fourth surface s44 is the same as that of the fourth surface s40 of the prism 173. The function of the sixth surface s64 is the same as that of the sixth surface s60 of the prism 173. The configuration of the fourth surface s44 is different from the configuration of the fourth surface s40 of the prism 173. The configuration of the sixth surface s64 is different from the configuration of the sixth surface s60 of the prism 173.

In the prism 173, the fourth surface s40 and a seventh surface s70 intersect with each other, and the sixth surface s60 and the seventh surface s70 intersect with each other. In the prism 174, on the other hand, the fourth surface s44 extends longer than the fourth surface s40 in a direction opposite to a line of intersection of the fourth surface s44 and the fifth surface s50, as illustrated in FIG. 7. Further, the sixth surface s64 extends longer than the sixth surface s60 in a direction opposite to a line of intersection of the sixth surface s64 and the fifth surface s50. Because the fourth surface s44 and the sixth surface s64 extend, the fourth surface s44 and the sixth surface s64 intersect with each other.

Because the fourth surface s44 and the sixth surface s64 extend and intersect with each other, the second prism 224 is expanded by the size of the region 224a and larger than the second prism 223. As illustrated in FIG. 7, the region 224a is positioned out of a progression path of electromagnetic waves incident from the first image forming unit 15 and to be detected by the first detector 19 and the second detector 20. Further, distances to the region 224a from, for example, a progression path of electromagnetic waves progressing in the fifth direction d5 and a progression path of electromagnetic waves progressing in the sixth direction d6 are equal to or longer than a predetermined distance. Thus, even if end surface reflection is occurred in the region 224a, surface reflection light is suppressed from reaching the first detector 19 and the second detector 20. Accordingly, the region 224a functions as a reflection suppressor 904a that suppresses surface reflection light caused by end surface reflection of the prism 174, which is unnecessary light, from being incident on the first detector 19 and the second detector 20.

In the fourth surface s44, the surface s44a corresponding to the region 224a is provided with a reflection suppressor 904b. The reflection suppressor 904b is formed by using the surface s44a as the end surface reflection suppression surface. In the sixth surface s64, further, the surface s64a corresponding to the region 224a is provided with a reflection suppressor 904c. The reflection suppressor 904c is formed by using the surface s64a as the end surface reflection suppression surface. By providing the reflection suppressor 904b on the surface s44a and providing the reflection suppressor 904c on the surface s64a, end surface reflection on these surfaces is suppressed.

In the present embodiment, as described above, the prism 174 is arranged at a position out of the progression paths of electromagnetic waves to be detected by the first detector 19 and the second detector 20 after being incident from the first image forming unit 15, and includes the region 224a that functions as the reflection suppressor 904a. Preferably, distances to the region 224a from the progression paths of electromagnetic waves to be detected by the first detector 19 and the second detector 20 are equal to or longer than the predetermined distance. This configuration suppresses surface reflection light that occurs in the region 224a of the prism 174 from being incident on the first detector 19 and the second detector 20. Accordingly, the electromagnetic wave detection apparatus 104 according to the present embodiment can reduce unnecessary light to be incident on the first detector 19 and the second detector 20.

Figure 8:
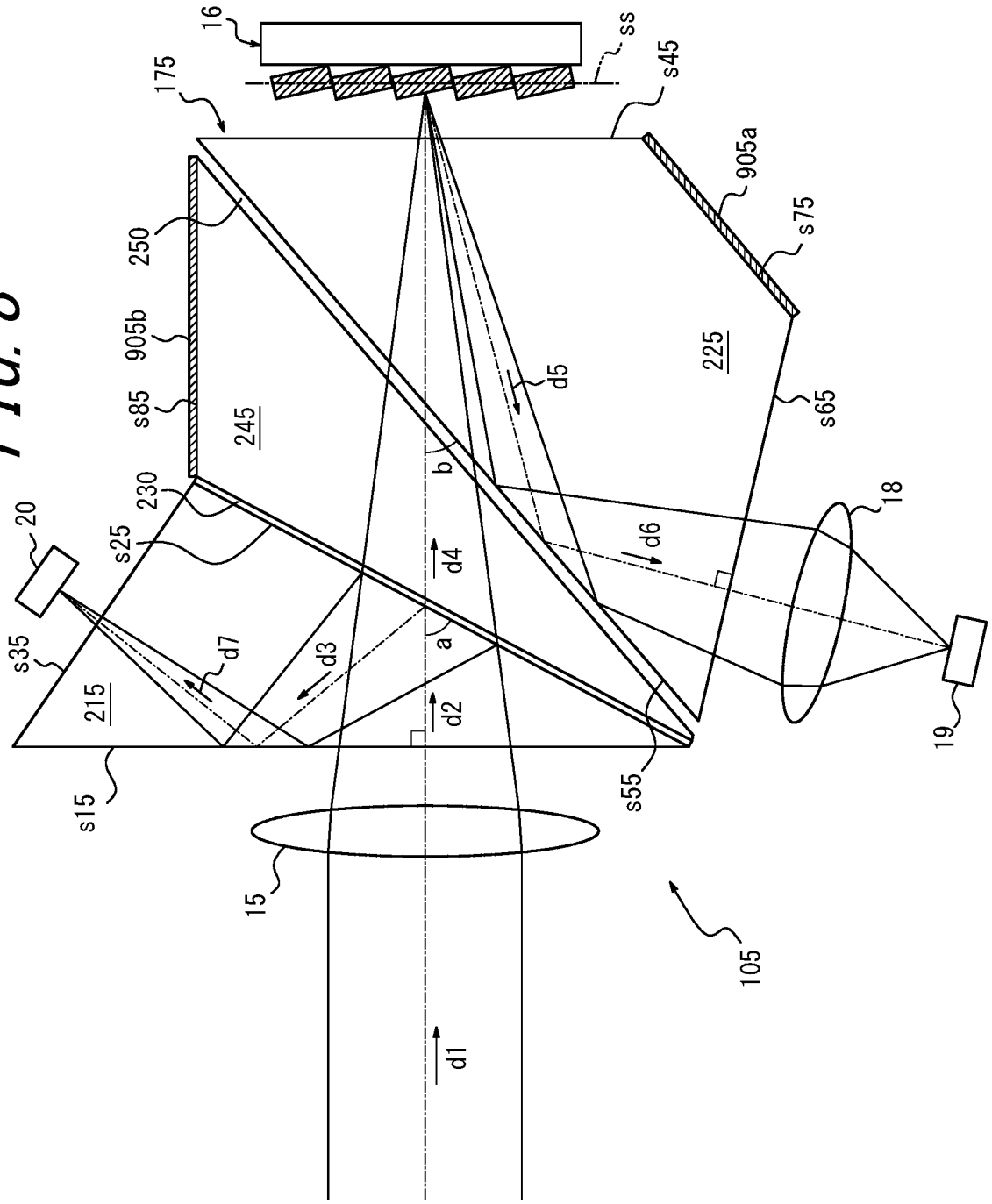
FIG. 8 is a diagram illustrating a schematic configuration of an electromagnetic wave detection apparatus according to a seventh embodiment of the present disclosure.

Next, an electromagnetic wave detection apparatus 105 according to a seventh embodiment of the present disclosure will be described with reference to FIG. 8. In FIG. 8, elements having the same configurations as those of each of the embodiments described above are denoted by the same reference signs.

The electromagnetic wave detection apparatus 105 according to the present embodiment includes the first image forming unit 15, the progression unit 16, a prism 175, the second image forming unit 18, the first detector 19, and the second detector 20, as illustrated in FIG. 8. That is, the electromagnetic wave detection apparatus 105 according to the present embodiment is different from the electromagnetic wave detection apparatus 100 according to the second embodiment, in terms of including the prism 175 in place of the prism 170. The configuration and function of the information acquisition system 11 according to the present embodiment other than the electromagnetic wave detection apparatus 105 are the same as those of the second embodiment.

The prism 175 contains at least a first surface s15, a second surface s25, a third surface s35, a fourth surface s45, a fifth surface s55, and a sixth surface s65.

The first surface s15 causes electromagnetic waves incident on the prism 175 from the first direction d1 to progress in the second direction d2. The first surface s15 may be perpendicular to a progression axis of electromagnetic waves incident on the first surface s15 from the first direction d1. Because the first direction d1 is parallel to the principal axis of the first image forming unit 15 as described above, the principal axis of the first image forming unit 15 and the first surface s15 may be perpendicular to each other, in other words, the principal plane of the image forming unit 15 and the first surface s15 may be parallel to each other. The first surface s15 may transmit or refract electromagnetic waves incident from the first direction d1 and cause the electromagnetic waves to progress in the second direction d2.

The first surface s15 causes electromagnetic waves progressing in the third direction d3 to progress in a seventh direction d7, as will be described later. The first surface s15 may internally reflect electromagnetic waves progressing in the third direction d3 and cause the electromagnetic waves to progress in the seventh direction d7. The first surface s15 may totally internally reflect electromagnetic waves progressing in the third direction d3 and cause the electromagnetic waves to progress in the seventh direction d7. An incident angle of electromagnetic waves progressing in the third direction d3 with respect to the first surface s15 may be equal to or larger than the critical angle.

The second surface s25 separates electromagnetic waves progressing in the second direction d2 into electromagnetic waves to progress in the third direction d3 and electromagnetic waves to progress in the fourth direction d4. The second surface s25 may cause electromagnetic waves in a particular wavelength band, from among electromagnetic waves progressing in the second direction d2, to progress in the third direction d3 and cause electromagnetic waves in another wavelength band to progress in the fourth direction d4. The second surface s25 may reflect electromagnetic waves in the particular wavelength band, from among electromagnetic waves progressing in the second direction d2, and causes the electromagnetic waves to progress in the third direction d3, and transmit or refract electromagnetic waves in another particular wavelength band to progress in the fourth direction d4. The second surface s25 may totally reflect electromagnetic waves in the particular wavelength band, from among electromagnetic waves progressing in the second direction d2, and cause the electromagnetic waves to progress in the third direction d3, and transmit or refract electromagnetic waves in another wavelength band and cause the electromagnetic waves to progress in the fourth direction d4. An incident angle of electromagnetic waves progressing in the second direction d2 with respect to the second surface s25 may be smaller than the critical angle.

The third surface s35 serving as the third emission surface emits electromagnetic waves having progressed in the seventh direction d7. The third surface s35 may be perpendicular to a progression axis of electromagnetic waves progressing in the seventh direction d7, that is, perpendicular to the seventh direction d7. Electromagnetic waves emitted from the third surface s35 are detected by the second detector 20.

The fourth surface s45 serving as the first emission surface emits electromagnetic waves having progressed in the fourth direction d4 to the reference surface ss of the progression unit 16. Further, the fourth surface s45 causes electromagnetic wave re-incident from the reference surface ss of the progression unit 16 to progress in the fifth direction d5. The fourth surface s45 may be perpendicular to the progression axis of electromagnetic wave progressing in the fourth direction d4, that is, perpendicular to the fourth direction d4. The fourth surface s45 may be parallel to the reference surface ss of the progression unit 16. The fourth surface s45 may transmit or refract electromagnetic waves re-incident from the reference surface ss and cause the electromagnetic waves to progress in the fifth direction d5.

The fifth surface s55 causes electromagnetic waves progressing in the fifth direction d5 to progress in the sixth direction d6. The fifth surface s55 may internally reflect electromagnetic waves progressing in the fifth direction d5 and cause the electromagnetic waves to progress in the sixth direction d6. The fifth surface s55 may totally internally reflect electromagnetic waves progressing in the fifth direction d5 and cause the electromagnetic waves to progress in the sixth direction d6. An incident angle of electromagnetic waves progressing in the fifth direction d5 with respect to the fifth surface s55 may be equal to or larger than the critical angle. The incident angle of electromagnetic waves progressing in the fifth direction d5 with respect to the fifth surface s55 may be different from the incident angle of electromagnetic waves progressing in the second direction d2 with respect to the second surface s25. The incident angle of electromagnetic waves progressing in the fifth direction d5 with respect to the fifth surface s55 may be larger than the incident angle of electromagnetic waves progressing in the second direction d2 with respect to the second surface s25. The fifth surface s55 does not need to be parallel to the second surface s25.

The sixth surface s65 serving as the second emission surface emits electromagnetic waves progressing in the sixth direction d6. The sixth surface s65 may be perpendicular to a progression axis of electromagnetic waves progressing in the sixth direction d6, that is, perpendicular to the sixth direction d6.

The prism 175 contains a first prism 215, a second prism 225, a third prism 245, a first intermediate layer 230, and a second intermediate layer 250.

The first prism 215 may contain a first surface s15, a second surface s25, and a third surface s35 as different surfaces. The first prism 215 includes, for example, a triangular prism. The first surface s15, the second surface s25, and the third surface s35 may intersect with one another.

The first prism 215 may be arranged such that a progression axis of electromagnetic waves incident on the first surface s15 from the first direction d1 and the first surface s15 are perpendicular to each other. The first prism 215 may be arranged such that the second surface s25 is positioned in a progression direction of electromagnetic waves that progress within the first prism 215 after being transmitted through or refracted by the first surface s15 from the first direction d1. The first prism 215 may be arranged such that the first surface s15 is positioned in a progression direction of electromagnetic waves after being reflected on the second surface s25. The first prism 215 may be arranged such that the third surface s35 is positioned in a progression direction of electromagnetic waves reflected on the first surface s15 after progressing in the third direction d3.

The second prism 225 may contain a fourth surface s45, a fifth surface s55, a sixth surface s65, and a seventh surface s75 as different surfaces. The seventh surface s75 may intersect with the fourth surface s45 and the sixth surface s65.

The second prism 225 may be arranged such that the fourth surface s45 is positioned in a progression direction of electromagnetic waves that progress within the second prism 225 via the fifth surface s55 after being transmitted through the second surface s25 of the first prism 215. The second prism 225 may be arranged such that the sixth surface s65 is positioned in the sixth direction, which is a reflection angle equal to an incident angle of electromagnetic waves from the fifth direction d5 with respect to the fifth surface s55. The second prism 225 may be arranged such that an angle b formed by the second direction d2 and the fifth surface s55 is smaller than an angle a formed by the second direction d2 and the second surface s25.

The third prism 245 may be arranged between the first intermediate layer 230 and the second intermediate layer 250. One slope of the third prism 245 may be in contact with the first intermediate layer 230. Another slope of the third prism 245 may be in contact with the second intermediate layer 250. The third prism 240 may contain the one slope in contact with the first intermediate layer 230, the another slope in contact with the second intermediate layer 250, and an eighth surface s85 intersecting with the one slope and the another slope, as different surfaces. The third prism 245 includes, for example, a triangular prism.

The first intermediate layer 230 may be arranged between the first prism 215 and the third prism 245. The first intermediate layer 230 may be in contact with the second surface s25 of the first prism 215 and may include the second surface s25 along the boundary surface with the first prism 215.

The second intermediate layer 250 may be arranged between the second prism 225 and the third prism 245. The second intermediate layer 250 may be in contact with the fifth surface s55 of the second prism 225 and may include the fifth surface s55 along the boundary surface with the second prism 225. The refractive index of the second intermediate layer 250 may be smaller than that of the second prism 225. Thus, electromagnetic waves that progress within the second prism 225 and are incident at an incident angle equal to or larger than the critical angle are totally internally reflected on the fifth surface s55. Accordingly, the fifth surface s55 internally reflects electromagnetic waves progressing within the second prism 225 in the fifth direction d5. In a configuration in which the incident angle of electromagnetic waves from the fifth direction d5 is equal to or larger than the critical angle, the fifth surface s55 totally internally reflects electromagnetic waves progressing in the fifth direction d5 within the second prism 225 and causes the electromagnetic waves to progress in the sixth direction d6.

In the present embodiment, the prism 175 includes a reflection suppressor 905a and a reflection suppressor 905b. The reflection suppressor 905a is provided on the seventh surface s75 of the second prism 225. The reflection suppressor 905b is provided on the eighth surface s85 of the third prism 245. Electromagnetic waves to be detected by the first detector 19 and the second detector 20 do not reach the seventh surface s75 provided with the reflection suppressor 905a and the eighth surface s85 provided with the reflection suppressor 905b, as illustrated in FIG. 8. Thus, the reflection suppressors 905a and 905b are provided at the respective positions out of progression paths of electromagnetic waves to be detected by the first detector 19 and the second detector 20. The reflection suppressor 905a is formed by using the seventh surface s75 as the end surface reflection suppression surface. The reflection suppressor 905b is formed by using the eighth surface s85 as the end surface reflection suppression surface. By using the seventh surface s75 and the eighth surface s85 as the end surface reflection suppression surfaces, end surface reflection on these surfaces can be suppressed. Accordingly, the electromagnetic wave detection apparatus 105 according to the present embodiment can suppress end surface reflection on the seventh surface s75 and the eighth surface s85 and reduce unwanted light to be incident on the first detector 19 and the second detector 20.

Figure 9:
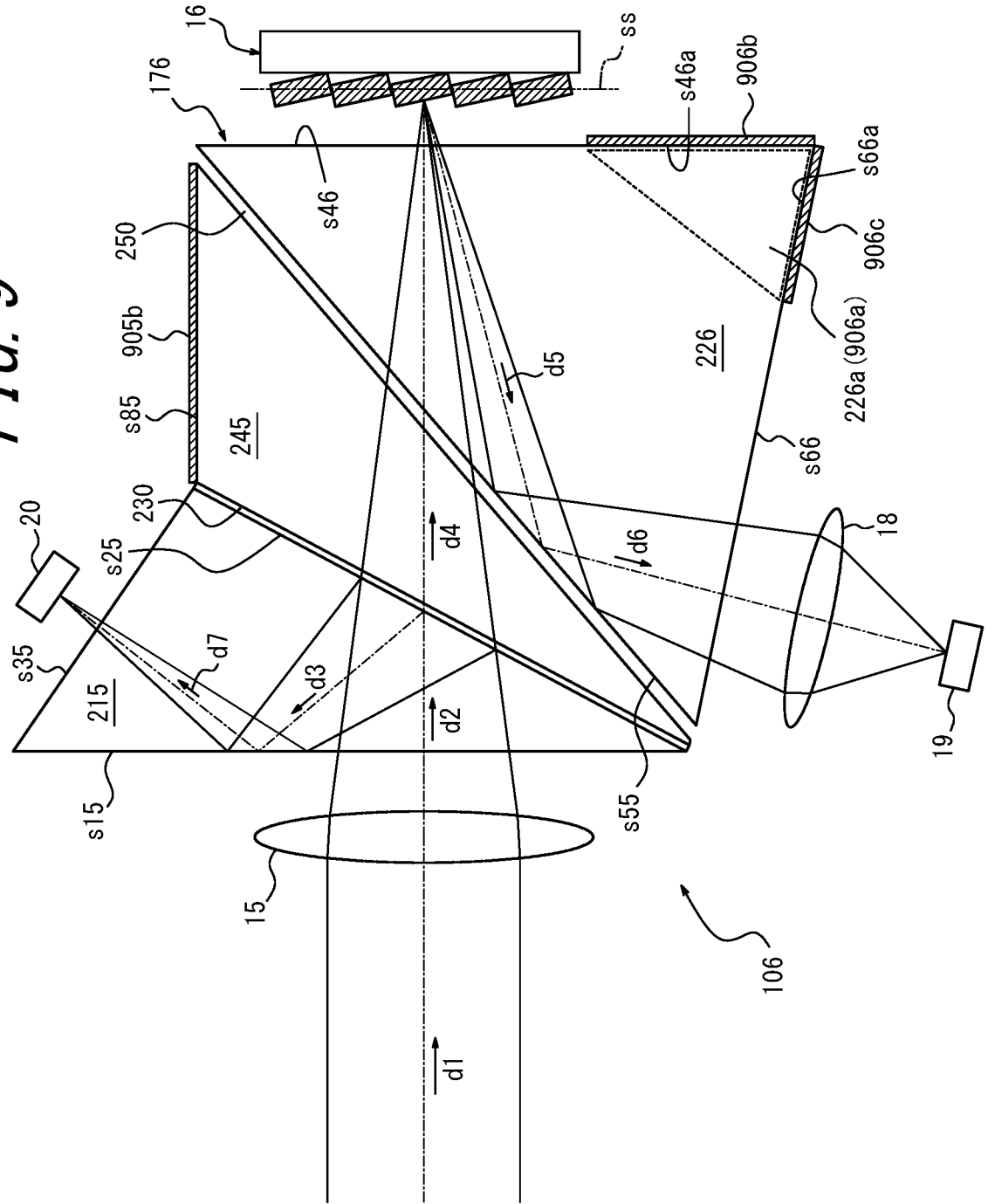
FIG. 9 a diagram illustrating a schematic configuration of an electromagnetic wave detection apparatus according to an eighth embodiment of the present disclosure.

Next, an electromagnetic wave detection apparatus 106 according to an eighth embodiment of the present disclosure will be described with reference to FIG. 9. In FIG. 9, elements having the same configurations as those of each of the embodiments described above are denoted by the same reference signs.

The electromagnetic wave detection apparatus 106 according to the present embodiment includes the first image forming unit 15, the progression unit 16, a prism 176, the second image forming unit 18, the first detector 19, and the second detector 20, as illustrated in FIG. 9. The electromagnetic wave detection apparatus 106 according to the present embodiment is different from the electromagnetic wave detection apparatus 105 according to the seventh embodiment, in terms of including the prism 176 in place of the prism 175. The configuration and function of the information acquisition system 11 according to the present embodiment other than the electromagnetic wave detection apparatus 106 are the same as those of the seventh embodiment.

The prism 176 includes a first prism 215, a second prism 226, a third prism 245, a first intermediate layer 230, and a second intermediate layer 250.

The second prism 226 may contain a fourth surface s46, a fifth surface s55, and a sixth surface s66 as different surfaces. The second prism 226 includes, for example, a triangular prism. The fourth surface s46, the fifth surface s55, and the sixth surface s66 may intersect with one another.

The function of the fourth surface s46 is the same as that of the fourth surface s45 of the prism 175. The function of the sixth surface s66 is the same as that of the sixth surface s65 of the prism 175. A configuration of the fourth surface s46 is different from that of the fourth surface s45 of the prism 175. A configuration of the sixth surface s66 is different from that of the sixth surface s65 of the prism 175.

In the prism 175, the fourth surface s45 and the seventh surface s75 intersect with each other, and the sixth surface s65 and the seventh surface s75 intersect with each other. In the prism 176, on the other hand, the fourth surface s46 extends longer than the fourth surface s45 in a direction opposite to a line of intersection of the fourth surface s46 and the fifth surface s55, as illustrated in FIG. 9. Further, the sixth surface s66 extends longer than the sixth surface s65 in a direction opposite to a line of intersection of the sixth surface s66 and the fifth surface s55. Because the fourth surface s46 and the sixth surface s66 extend, the fourth surface s46 and the sixth surface s66 intersect with each other.

Because the fourth surface s46 and the sixth surface s66 extend and intersect with each other, the second prism 226 is expanded by the size of the region 226a and larger than the second prism 225. The region 226a is positioned out of the progression paths of electromagnetic waves to be detected by the first detector 19 and the second detector 20 after being incident from the first image forming unit 15, as illustrated in FIG. 9. Further, distances to the region 226a from the progression paths of electromagnetic waves, e.g., the progression path of electromagnetic waves progressing in the fifth direction d5 and the progression path of electromagnetic waves progressing in the sixth direction d6 are equal to or longer than a predetermined distance. Thus, even if end surface reflection occurs in the region 226a, surface reflection light is suppressed from reaching the first detector 19 and the second detector 20. Accordingly, the region 226a functions as a reflection suppressor 906a that suppresses surface reflection light caused by end surface reflection of the prism 176, which is unnecessary light, from being incident on the first detector 19 and the second detector 20.

In the fourth surface s46, the surface s46a corresponding to the region 226a is provided with a reflection suppressor 906b. The reflection suppressor 906b is formed by using the surface s46a as the end surface reflection suppression surface. Further, in the sixth surface s66, the surface s66a corresponding to the region 226a is provided with a reflection suppressor 906c. The reflection suppressor 906c is formed by using the surface s66a as the end surface reflection suppression surface. By providing the reflection suppressor 906b on the surface s46a and providing the reflection suppressor 906c on the surface s66a, end surface reflection on these surfaces is suppressed.

In the present embodiment, as described above, the prism 176 includes the region 226a serving as the reflection suppressor 906a that is arranged at a position out of the progression paths of electromagnetic waves to be detected by the first detector 19 and the second detector 20 after being incident from the first image forming unit 15. Preferably, the distances to the region 226a from the progression paths of electromagnetic waves to be detected by the first detector 19 and the second detector 20 are equal to or longer than the predetermined distance. In this configuration, even if end surface reflection occurs in the region 226a of the prism 176, surface reflection light is suppressed from being incident on the first detector 19 and the second detector 20. Accordingly, the electromagnetic wave detection apparatus 106 according to the present embodiment can reduce unnecessary light to be incident on the first detector 19 and the second detector 20.

Figure 10:
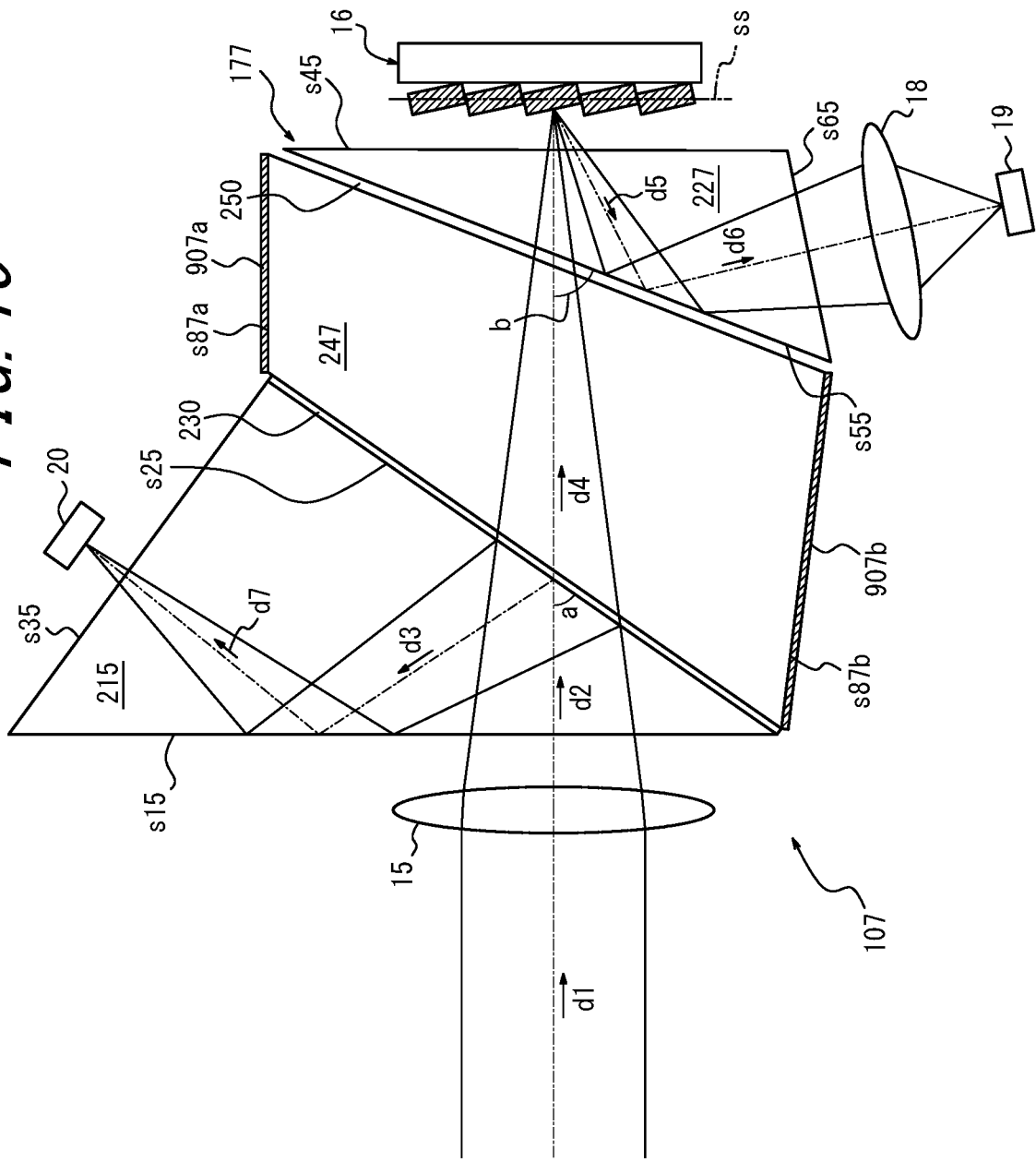
FIG. 10 is a diagram illustrating a schematic configuration of an electromagnetic wave detection apparatus according to a ninth embodiment of the present disclosure.

Next, an electromagnetic wave detection apparatus 107 according to a ninth embodiment of the present disclosure will be described with reference to FIG. 10. In FIG. 10, elements having the same configurations as those of each of the embodiments described above are denoted by the same reference signs.

The electromagnetic wave detection apparatus 107 according to the present embodiment includes the first image forming unit 15, the progression unit 16, a prism 177, the second image forming unit 18, the first detector 19, and the second detector 20, as illustrated in FIG. 10. The electromagnetic wave detection apparatus 107 according to the present embodiment is different from the electromagnetic wave detection apparatus 105 according to the seventh embodiment, in terms of including the prism 177 in place of the prism 175. The configuration and function of the information acquisition system 11 according to the present embodiment other than the electromagnetic wave detection apparatus 107 are the same as those of the seventh embodiment.

The prism 175 contains at least a first surface s15, a second surface s25, a third surface s35, a fourth surface s45, a fifth surface s55, and a sixth surface s65. The configuration and function of these surfaces are the same as those of the seventh embodiment.

The prism 177 includes a first prism 215, a second prism 227, a third prism 247, a first intermediate layer 230, and a second intermediate layer 250.

The second prism 227 may contain a fourth surface s45, a fifth surface s55, and a sixth surface s65 as different surfaces. The second prism 227 includes, for example, a triangular prism. The fourth surface s45, the fifth surface s55, and the sixth surface s65 may intersect with one another.

The second prism 227 may be arranged in the same manner as the seventh embodiment such that the fourth surface s45 is positioned in the progression direction of electromagnetic waves that progress within the second prism 227 via the fifth surface s55 after being transmitted through the second surface s25 of the first prism 215. The second prism 227 may be arranged in the same manner as the seventh embodiment such that the sixth surface s65 is positioned in the sixth direction d6, which is the reflection angle equal to the incident angle of electromagnetic waves from the fifth direction d5 with respect to the fifth surface s55. The second prism 227 may be arranged in a manner different from the seventh embodiment such that an angle b formed by the second direction d2 and the fifth surface s55 is larger than an angle a formed by the second direction d2 and the second surface s25.

The third prism 247 may be arranged between the first intermediate layer 230 and the second intermediate layer 250. The third prism 247 may contain a plate-like shape. One plate surface of the third prism 247 may be in contact with the first intermediate layer 230. The other plate surface of the third prism 247 may be in contact with the second intermediate layer 250. The third prism 247 may include an eighth surface s87a that intersects with one end of the one plate surface of the third prism 247 and one end of the other plate surface and an eighth surface s87b that intersects with the other end of the one plate surface of the third prism 247 and the other end of the other plate surface.

In the present embodiment, the prism 177 includes a reflection suppressor 907a and a reflection suppressor 907b. The reflection suppressor 907a is provided on the eighth surface s87a of the third prism 247. The reflection suppressor 907b is provided on the eighth surface s87b of the third prism 247. Electromagnetic waves to be detected by the first detector 19 and the second detector 20 do not reach the eighth surface s87a provided with the reflection suppressor 907a and the eighth surface s87b provided with the reflection suppressor 907b, as illustrated in FIG. 10. Thus, the reflection suppressors 907a and 907b are provided at positions out of the progression paths of the electromagnetic waves to be detected by the first detector 19 and the second detector 20. The reflection suppressor 907a is formed by using the eighth surface s87a as the end surface reflection suppression surface. The reflection suppressor 907b is formed by using the eighth surface s87b as the end surface reflection suppression surface. By using the eighth surface s87a and the eighth surface s87b as the end surface reflection suppression surfaces, end surface reflection on these surfaces can be suppressed. Accordingly, the electromagnetic wave detection apparatus 107 according to the present embodiment can suppress end surface reflection on the eighth surface s87a and the eighth surface s87b and reduce unwanted light to be incident on the first detector 19 and the second detector 20.

Figure 11:
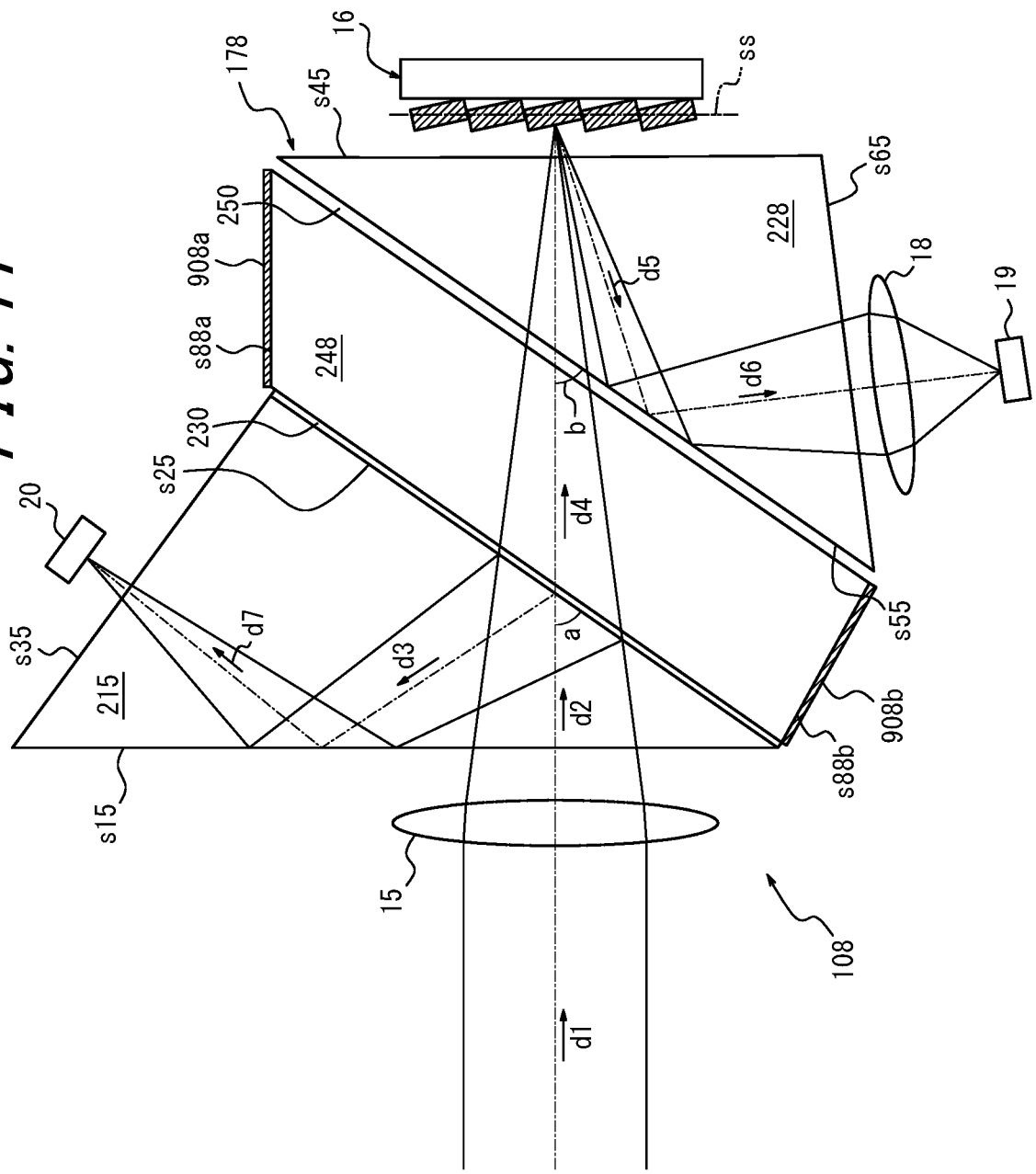
FIG. 11 is a diagram illustrating a schematic configuration of an electromagnetic wave detection apparatus according to a tenth embodiment of the present disclosure.

Next, an electromagnetic wave detection apparatus 108 according to a tenth embodiment of the present disclosure will be described with reference to FIG. 11. In FIG. 11, elements having the same configurations as those of each of the embodiments described above are denoted by the same reference signs.

The electromagnetic wave detection apparatus 108 according to the present embodiment includes the first image forming unit 15, the progression unit 16, a prism 178, the second image forming unit 18, the first detector 19, and the second detector 20, as illustrated in FIG. 11. The electromagnetic wave detection apparatus 108 according to the present embodiment is different from the electromagnetic wave detection apparatus 107 according to the ninth embodiment, in terms of including the prism 178 in place of the prism 177. The configuration and function of the information acquisition system 11 according to the present embodiment other than the electromagnetic wave detection apparatus 108 are the same as those of the ninth embodiment.

The prism 178 contains at least a first surface s15, a second surface s25, a third surface s35, a fourth surface s45, a fifth surface s55, and a sixth surface s65. The configuration and function of these surfaces are the same as those of the ninth embodiment.

The prism 178 includes a first prism 215, a second prism 228, a third prism 248, a first intermediate layer 230, and a second intermediate layer 250.

The second prism 228 may contain the fourth surface s45, the fifth surface s55, and the sixth surface s65 as different surfaces. The second prism 228 includes, for example, a triangular prism. The fourth surface s45, the fifth surface s55, and the sixth surface s65 may intersect with one another.

The second prism 228 may be arranged in the same manner as the ninth embodiment such that the fourth surface s45 is positioned in the progression direction of electromagnetic waves progressing within the second prism 228 via the fifth surface s55 after being transmitted through the second surface s25 of the first prism 215. The second prism 228 may be arranged in the same manner as the ninth embodiment such that the sixth surface s65 is positioned in the sixth direction d6, which is the reflection angle equal to the incident angle of electromagnetic waves from the fifth direction d5 with respect to the fifth surface s55. The second prism 228 may be arranged in a manner different from the ninth embodiment such that an angle a formed by the second direction d2 and the second surface s25 and an angle b formed by the second direction d2 and the fifth surface s55 are equal to each other.

The third prism 248 may be arranged between the first intermediate layer 230 and the second intermediate layer 250. The third prism 248 may contain a plate-like shape. One plate surface of the third prism 248 may be in contact with the first intermediate layer 230. The other plate surface of the third prism 248 may be in contact with the second intermediate layer 250. The third prism 248 may include an eight surface s88a that intersects with one end of the one plate surface and one end of the other plate surface, and an eight surface s88b that intersects with the other end of one plate surface and the other end of the other plate surface.

In the present embodiment, the prism 178 includes a reflection suppressor 908a and a reflection suppressor 908b. The reflection suppressor 908a is provided on the eighth surface s88a of the third prism 248. The reflection suppressor 908b is provided on the eighth surface s88b of the third prism 248. As illustrated in FIG. 11, electromagnetic waves to be detected by the first detector 19 and the second detector 20 do not reach the eighth surface s88a provided with the reflection suppressor 908a and the eighth surface s88b provided with the reflection suppressor 908b. Thus, the reflection suppressors 908a and 908b are provided at positions out of the progression paths of electromagnetic waves to be detected by the first detector 19 and the second detector 20. The reflection suppressor 908a is formed by using the eighth surface s88a as the end surface reflection suppression surface. The reflection suppressor 908b is formed by using the eighth surface s88b as the end surface reflection suppression surface. By using the eighth surface s88a and the eighth surface s88b as the end surface reflection suppression surfaces, end surface reflection on these surfaces can be suppressed. Accordingly, the electromagnetic wave detection apparatus 108 according to the present embodiment can reduce unnecessary light to be incident on the first detector 19 and the second detector 20.

Figure 12:
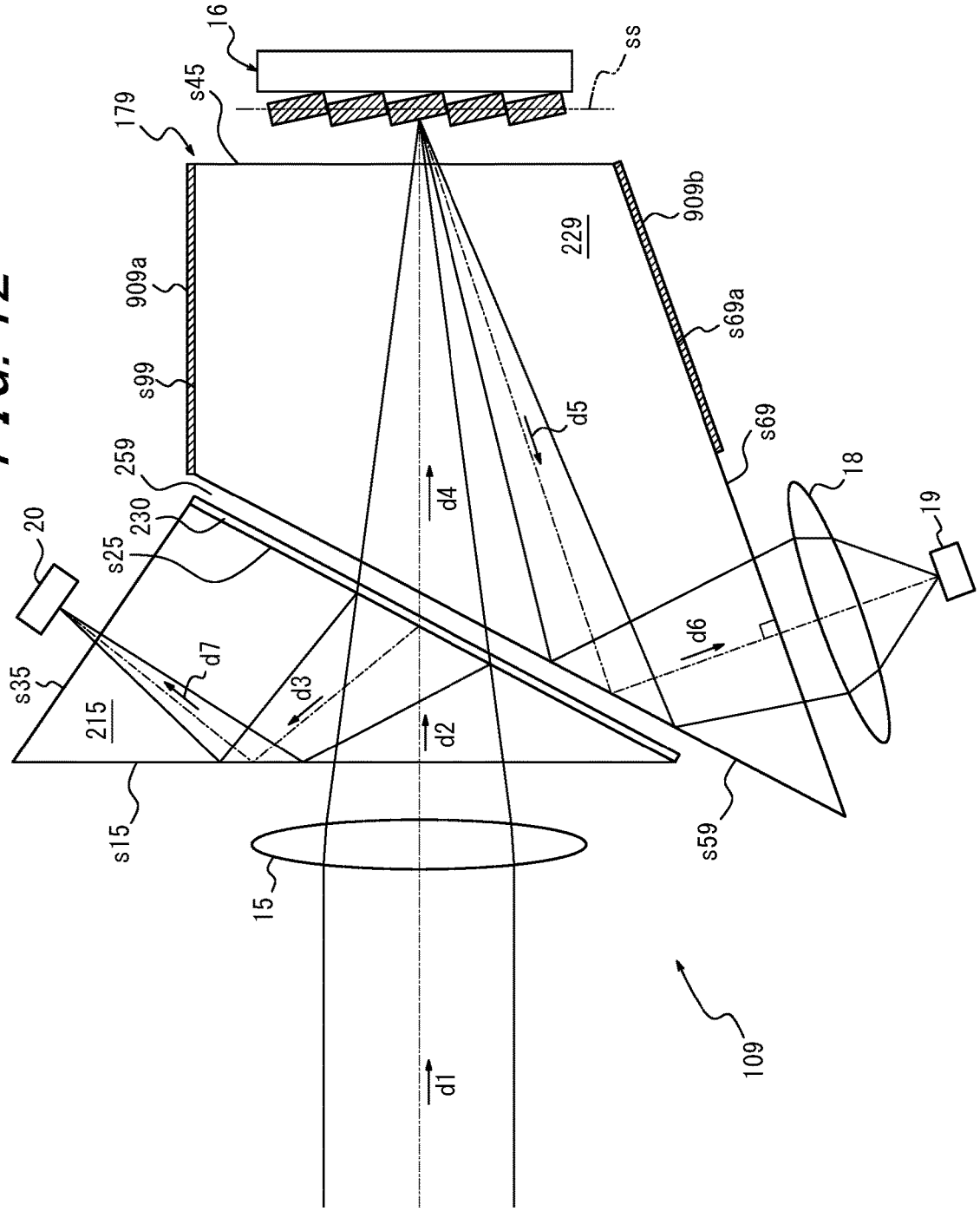
FIG. 12 is a diagram illustrating a schematic configuration of an electromagnetic wave detection apparatus according to an eleventh embodiment of the present disclosure.

Next, an electromagnetic wave detection apparatus 109 according to an eleventh embodiment of the present disclosure will be described with reference to FIG. 12. In FIG. 12, elements having the same configurations as those of each of the embodiments described above are denoted by the same reference signs.

The electromagnetic wave detection apparatus 109 according to the present embodiment includes the first image forming unit 15, the progression unit 16, a prism 179, the second image forming unit 18, the first detector 19, and the second detector 20, as illustrated in FIG. 12. The electromagnetic wave detection apparatus 109 according to the present embodiment is different from the electromagnetic wave detection apparatus 107 according to the seventh embodiment, in terms of including the prism 179 in place of the prism 177. The configuration and function of the information acquisition system 11 according to the present embodiment other than the electromagnetic wave detection apparatus 109 are the same as those of the seventh embodiment.

The prism 179 contains at least a first surface s15, a second surface s25, a third surface s35, a fourth surface s45, a fifth surface s59, and a sixth surface s69. In the present embodiment, the configurations and functions of the first surface s15, the second surface s25, the third surface s35, and the fourth surface s45 are the same as those of the seventh embodiment.

The fifth surface s59 causes electromagnetic waves progressing in the fifth direction d5 to progress in the sixth direction d6. The fifth surface s59 may internally reflect electromagnetic waves progressing in the fifth direction d5 and cause the electromagnetic waves to progress in the sixth direction d6. The fifth surface s59 may totally internally reflect electromagnetic waves progressing in the fifth direction d5 and cause the electromagnetic waves to progress in the sixth direction d6. An incident angle of electromagnetic waves progressing in the fifth direction d5 with respect to the fifth surface s59 may be equal to or larger than the critical angle. The incident angle of electromagnetic waves progressing in the fifth direction d5 with respect to the fifth surface s59 may be different from the incident angle of electromagnetic waves progressing in the second direction d2 with respect to the second surface s25. The incident angle of electromagnetic waves progressing in the fifth direction d5 with respect to the fifth surface s59 may be larger than the incident angle of electromagnetic waves progressing in the second direction d2 with respect to the second surface s25. The fifth surface s59 may be parallel to the second surface s25.

The sixth surface s69 emits electromagnetic waves progressing in the sixth direction d6. The sixth surface s69 may be perpendicular to the progression axis of electromagnetic waves progressing in the sixth direction d6, that is, perpendicular to the sixth direction d6. As illustrated in FIG. 12, electromagnetic waves progressing in the sixth direction d6 is emitted from a portion of the sixth surface s69 closer to the line of intersection of the sixth surface s69 and the fifth surface s59 than the line of intersection of the sixth surface s69 with the fourth surface s45. Thus, the sixth surface s69 includes a surface s69a that extends from the line of intersection of the sixth surface s69 and the fourth surface s45 and is positioned out of the progression path of electromagnetic waves to be detected by the first detector 19.

The prism 179 includes a first prism 215, a second prism 229, a first intermediate layer 230, and a second intermediate layer 259.

The second prism 229 may have the fourth surface s45, the fifth surface s59, the sixth surface s69, and a ninth surface s99 as different surfaces. The ninth surface 99 may intersect with the fourth surface s45 and the fifth surface s59.

The second prism 229 may be arranged such that the fifth surface s59 is parallel to and opposes the second surface s25 of the first prism 215. The second prism 229 may be arranged such that the fourth surface s45 is positioned in a progression direction of electromagnetic waves progressing within the second prism 229 via the fifth surface s59 after being transmitted through the second surface s25 of the first prism 215. The second prism 229 may be arranged such that the sixth surface s69 is positioned in the sixth direction d6, which is a reflection angle equal to the incident angle of electromagnetic waves from the fifth direction d5 with respect to the fifth surface s59.

The second intermediate layer 259 may be arranged between the fifth surface s59 of the second prism 229 and the first intermediate layer 230. The second intermediate layer 259 may by in contact with the fifth surface s59 of the second prism 229 and may include the fifth surface s59 along the boundary surface with the second prism 229. The second intermediate layer 259 may be in contact with the surface of the first intermediate layer 230 on an opposite side from a contact surface of the first intermediate layer 230 in contact with the first prism 215.

The second intermediate layer 259 may have a refractive index smaller than that of the second prism 229. The second intermediate layer 259 includes, for example, at least one of vacuum, a gas, a liquid, and a solid, which has a refractive index smaller than that of the second prism 229. Thus, electromagnetic waves progressing within the second prism 229 and incident at an incident angle equal to or larger than the critical angle are totally internally reflected on the fifth surface s59. Accordingly, the fifth surface s59 internally reflects electromagnetic waves progressing within the second prism 229 in the fifth direction d5 serving as the progression axis. In a configuration in which the incident angle of electromagnetic waves from the fifth direction d5 is equal to or larger than the critical angle, the fifth surface s59 totally internally reflects electromagnetic waves progressing in the fifth direction d5 and causes the electromagnetic waves to progress in the sixth direction d6.

In the present embodiment, the prism 179 includes a reflection suppressor 909a and a reflection suppressor 909b. The reflection suppressor 909a is provided on the ninth surface s99 of the second prism 229. The reflection suppressor 909b is provided on the surface s69a of the second prism 229. As illustrated in FIG. 12, electromagnetic waves to be detected by the first detector 19 and the second detector 20 do not reach the surface s99a provided with the reflection suppressor 909a and the surface s69a provided with the reflection suppressor 909b. Thus, the reflection suppressors 909a and 909b are arranged at positions out of the progression paths of electromagnetic waves to be detected by the first detector 19 and the second detector 20. The reflection suppressor 909a is formed by using the ninth surface s99 as the end surface reflection suppression surface. The reflection suppressor 909b is formed by using the surface s69a as the end surface reflection suppression surface. By using the ninth surface s99 and the surface s69a as the end surface reflection suppression surfaces, end surface reflection on these surfaces can be suppressed. Accordingly, the electromagnetic wave detection apparatus 109 according to the present embodiment can reduce unnecessary light to be incident on the first detector 19 and the second detector 20.

Although the present disclosure has been described based on the drawings and embodiments, it should be appreciated that those who are skilled in the art may easily perform variations or alterations based on the present disclosure. Accordingly, such variations and alterations are to be included in the scope of the present disclosure.

For example, in the first to eleventh embodiments, the radiation unit 12, the scanner 13, and the controller 14 constitute the information acquisition system 11, together with the electromagnetic wave detection apparatus 10, 100, 101, 102, 103, 104, 105, 106, 107, 108, or 109. However, the electromagnetic wave detection apparatus 10, 100, 101, 102, 103, 104, 105, 106, 107, 108, and 109 may be configured including at least one of them.

Figure 13:
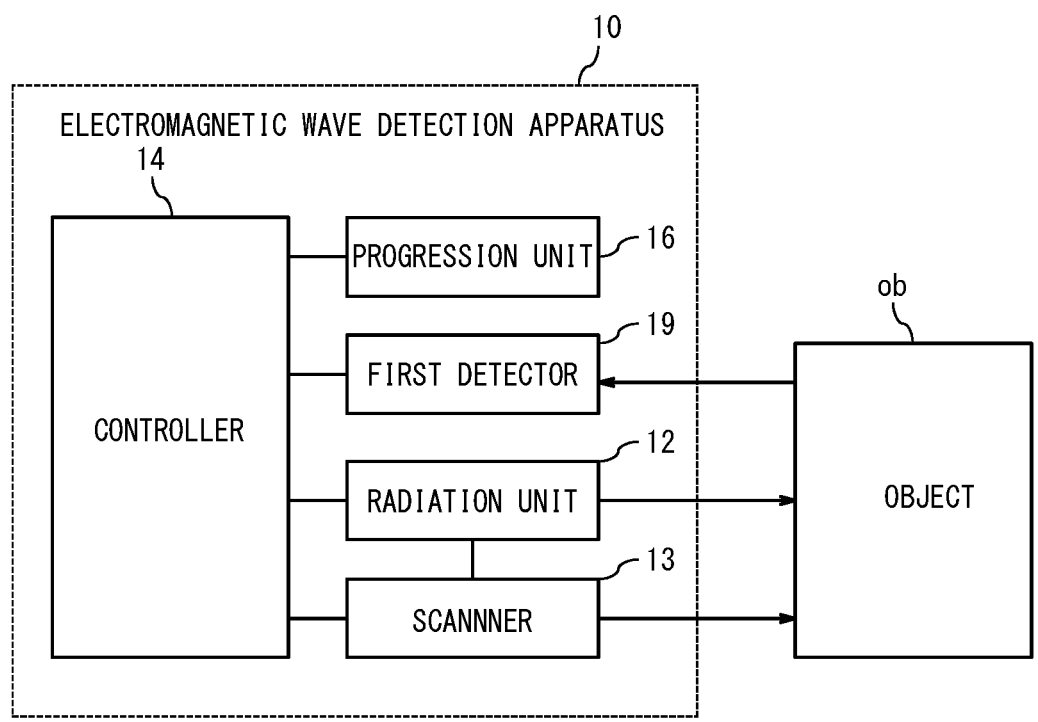
FIG. 13 is a diagram illustrating another example configuration of the electromagnetic wave detection apparatus according to the first embodiment of the present disclosure.

Thus, for example, the electromagnetic wave detection apparatus 10 according to the first embodiment may include the radiation unit 12, the scanner 13, and the controller 14, as illustrated in FIG. 13. Similarly, the electromagnetic wave detection apparatus 100, 101, 102, 103, 104, 105, 106, 107, 108, and 109 according to the second to eleventh embodiments may include the radiation unit 12, the scanner 13, and the controller 14.

Although in the first to eleventh embodiments the progression unit 16 can switch the progression direction of electromagnetic waves incident on the reference surface ss in the two directions: the first selection direction ds1 and the second selection direction ds2, the progression unit 16 can switch the progression direction between three or more directions.

Although in the first to eleventh embodiments the first state and the second state of the progression unit 16 are respectively the first reflection state to reflect electromagnetic waves incident on the reference surface ss in the first selection direction ds1 and the second reflection state to reflect the electromagnetic waves in the second selection direction ds2, these states may refer to other conditions.

For example, the second state may refer to a transmitting state in which electromagnetic waves incident on the reference surface ss are transmitted through and caused to progress in the second selection direction ds2. The progression unit 16 may include a shutter that is provided for each of the pixels px and has a reflection surface for reflecting electromagnetic waves in the first selection direction ds1. The progression unit 16 having this configuration can switch between the reflection state serving as the first state and the transmission state serving as the second state, by opening or closing the shutter for each of the pixels px.

The progression unit 16 may be, for example, a progression unit that includes a MEMS shutter in which a plurality of shutters capable of opening and closing are arranged in an array. The progression unit 16 may be a progression unit that includes a liquid crystal shutter capable of switching between a reflection state for reflecting electromagnetic waves and a transmission state for transmitting electromagnetic waves according to a liquid crystal alignment. The progression unit 16 having such a configuration can switch between the reflection state serving as the first state and the transmission state serving as the second state for each of the pixels px by switching the liquid crystal alignment for each of the pixels px.

Further, in the first to eleventh embodiments, the information acquisition system 11 has a configuration in which the scanner 13 is caused to scan a beam of electromagnetic waves radiated from the radiation unit 12 and causes the first detector 19 to function as a scanning type active sensor in cooperation with the scanner 13. However, the information acquisition system 11 is not limited to such a configuration. For example, the information acquisition system 11 may have a configuration in which the scanner 13 is omitted and the radiation unit 12 having a plurality of radiation sources capable of radiating radial electromagnetic waves functions as a scanning type active sensor using a phased-scanning method for radiating electromagnetic waves from each of the radiation sources at phased radiation timings. The information acquisition system 11 may have a configuration in which the scanner 13 is omitted and the radiation unit 12 radiates radial electromagnetic waves and information is acquired without scanning.

In the second to eleventh embodiments, further, the information acquisition system 11 has a configuration in which the first detector 19 is an active sensor and the second detector 20 is a passive sensor. However, the information acquisition system 11 is not limited to such a configuration. For example, the information acquisition system 11 may have a configuration in which both the first detector 19 and the second detector 20 serve as active sensors. In such a configuration in which both the first detector 19 and the second detector 20 serve as active sensors, either the radiation unit 12 or respective radiation units 12 may radiate electromagnetic waves to the object ob. Further, the respective radiation units 12 may radiate electromagnetic waves of the same type or different types.

REFERENCE SIGNS LIST 10, 100-109 electromagnetic wave detection apparatus
11 information acquisition system
12 radiation unit
13 scanner
14 controller
15 first image forming unit
16, 16a progression unit
17, 170-179 prism
18 second image forming unit
19 first detector
20 second detector
21, 210, 215 first prism
22, 220-229 second prism
23, 230 first intermediate layer
240, 242, 243, 245, 247, 248 third prism
250, 259 second intermediate layer
90, 900a, 900b, 901a, 901b, 901c, 902, 903a, 903b, 904a, 904b, 904c, 905a, 905b, 906a, 906b, 906c, 907a, 907b, 908a, 908b, 909a, 909b reflection suppressor
d1, d2, d3, d4, d5, d6, d7 first direction, second direction, third direction, fourth direction, fifth direction, sixth direction, seventh direction
ds1, ds2 first selection direction, second selection direction
s1, s15 first surface
s2, s20, s25 second surface
s3, s30, s35 third surface
s4, s40, s41, s44, s45, s46 fourth surface
s5, s50, s55, s59 fifth surface
s6, s60, s61, s64, s65, s66, s69 sixth surface
s70, s75 seventh surface
s83a, s83b, s85, s87a, s87b, s88a, s88b eighth surface
s99 ninth surface
ob object
px pixel
ss reference surface

The invention claimed is:

1. An electromagnetic wave detection apparatus comprising:
   an image forming unit configured to form an image of incident electromagnetic waves;
   a prism having a first emission surface for emitting electromagnetic waves incident from the image forming unit;
   a progression unit that includes a plurality of pixels arranged along a reference surface and is configured to cause electromagnetic waves incident on the reference surface from the first emission surface to progress in a particular direction using each of the pixels;
   a first detector configured to detect electromagnetic waves progressing in the particular direction; and
   a second detector,
   wherein the prism includes a reflection suppressor that is provided at a position out of a progression path of electromagnetic waves incident from the image forming unit to be detected by the first detector and suppresses unnecessary light caused by end surface reflection of the prism from being incident on the first detector,
   the prism separates electromagnetic waves incident from the image forming unit into electromagnetic waves to progress in a second progression direction and electromagnetic waves to progress in a third progression direction and emits the electromagnetic waves progressing in the second progression direction to the reference surface from the first emission surface,
   the prism reflects electromagnetic waves in a particular wavelength band and causes the electromagnetic waves to progress in the third progression direction, and causes electromagnetic waves in another wavelength band to progress in the second progression direction,
   the prism has a third emission surface for emitting electromagnetic waves progressing in the third progression direction,
   the second detector is configured to detect electromagnetic waves emitted from the third emission surface, and
   the reflection suppressor is provided at a position out of progression paths of electromagnetic waves to be detected by the first detector and the second detector.

2. The electromagnetic wave detection apparatus according to claim 1,
   wherein the reflection suppressor is provided at the position on an interface between the prism and another medium in contact with the prism.

3. The electromagnetic wave detection apparatus according to claim 1,
   wherein electromagnetic waves progressing in the particular direction are re-incident on a first emission surface,
   the prism has a second emission surface for emitting electromagnetic waves progressing in a first progression direction after being re-incident from the first emission surface; and
   the first detector is configured to detect electromagnetic waves emitted from the second emission surface.

4. The electromagnetic wave detection apparatus according to claim 1,
   wherein the second detector includes a sensor of the same type as or a different type from the first detector.

5. The electromagnetic wave detection apparatus according to claim 1,
   wherein the second detector is configured to detect electromagnetic waves of the same type or a different type of electromagnetic waves detected by the first detector.

6. The electromagnetic wave detection apparatus according to claim 1,
   wherein the progression unit switches each of the pixels between a first reflection state in which electromagnetic waves incident on a reference surface is reflected in the particular direction and a second reflection state in which the electromagnetic waves are reflected in a direction different from the particular direction.

7. The electromagnetic wave detection apparatus according to claim 6,
   wherein the progression unit includes a reflection surface for reflecting electromagnetic waves for each of the pixels and switches between the first reflection state and the second reflection state by changing an orientation of the reflection surface for each of the pixels.

8. An information acquisition system comprising:
   the electromagnetic wave detection apparatus according to claim 1; and
   a controller configured to acquire information regarding the surroundings of the electromagnetic wave detection apparatus, based on a detection result of electromagnetic waves by the first detector.

9. An information acquisition system comprising:
   the electromagnetic wave detection apparatus according to claim 1; and
   a controller configured to acquire information regarding the surroundings of the electromagnetic wave detection apparatus, based on a detection result of electromagnetic waves by the second detector.

10. An electromagnetic wave detection apparatus comprising:
    a first detector configured to detect electromagnetic waves;
    a second detector configured to detect electromagnetic waves;
    a progression unit that includes a plurality of pixels arranged along a reference surface;
    a first prism having a first surface on which an electromagnetic waves are incident from an image forming unit, a second surface configured to reflect a part of the electromagnetic waves and transmit the other part, and a third surface configured to transmit the electromagnetic waves reflected by the second surface and cause to progress to the second detection unit;
    a second prism having a fourth surface configured to cause the electromagnetic waves transmitted through the second surface to progress to the progression unit, a fifth surface configured to progress the electromagnetic waves transmitted through the second surface to the fourth surface, and a sixth surface configured to transmit the electromagnetic waves reflected by the fifth surface and cause to progress to the first detector; and
    a third prism having a surface that opposes to the second surface, a surface that opposes to the fifth surface, and an eighth surface that intersects with these surfaces, and is arranged between the first prism and the second prism,
    wherein each of the plurality of pixels can switch between a first state in which incident electromagnetic waves progress in a particular direction and a second state in which incident electromagnetic waves progress in a direction different from the particular direction, the fifth surface reflects the electromagnetic waves progressed by the pixel in the first state and causes to progresses to the sixth surface, and a reflection suppressor that suppresses unnecessary light from being incident on the first detector is arranged on the eighth surface.

* * * * *